United States Patent
Endoh

(10) Patent No.: US 9,786,743 B2
(45) Date of Patent: Oct. 10, 2017

(54) SEMICONDUCTOR DEVICE WITH ELECTRON SUPPLY LAYER

(71) Applicant: FUJITSU LIMITED, Kawasaki-shi, Kanagawa (JP)

(72) Inventor: Akira Endoh, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/828,995

(22) Filed: Aug. 18, 2015

(65) Prior Publication Data

US 2015/0357420 A1 Dec. 10, 2015

Related U.S. Application Data

(63) Continuation of application No. PCT/JP2013/057658, filed on Mar. 18, 2013.

(51) Int. Cl.
| | |
|---|---|
| H01L 29/15 | (2006.01) |
| H01L 31/0256 | (2006.01) |
| H01L 29/205 | (2006.01) |
| H01L 29/778 | (2006.01) |
| H01L 29/43 | (2006.01) |
| H01L 29/66 | (2006.01) |
| H01L 29/20 | (2006.01) |

(52) U.S. Cl.
CPC .......... *H01L 29/205* (2013.01); *H01L 29/432* (2013.01); *H01L 29/66462* (2013.01); *H01L 29/778* (2013.01); *H01L 29/7784* (2013.01); *H01L 29/7787* (2013.01); *H01L 29/2003* (2013.01)

(58) Field of Classification Search
CPC .. H01L 29/7787; H01L 29/778; H01L 29/205

USPC ................... 257/76, 201, 194, 280
See application file for complete search history.

(56) References Cited

U.S. PATENT DOCUMENTS

| | | | | |
|---|---|---|---|---|
| 5,023,674 A | * | 6/1991 | Hikosaka | H01L 29/205 257/192 |
| 5,061,970 A | * | 10/1991 | Goronkin | H01L 29/155 257/15 |
| 5,250,822 A | * | 10/1993 | Sonoda | H01L 29/7783 257/192 |

(Continued)

FOREIGN PATENT DOCUMENTS

| | | |
|---|---|---|
| EP | 0803912 A1 | 10/1997 |
| JP | 9-252113 | 9/1997 |

(Continued)

OTHER PUBLICATIONS

International Search Report, mailed in connection with PCT/JP2013/057658 and dated May 14, 2013.

(Continued)

*Primary Examiner* — Olik Chaudhuri
*Assistant Examiner* — Wilner Jean Baptiste
(74) *Attorney, Agent, or Firm* — Fujitsu Patent Center

(57) ABSTRACT

A semiconductor device includes a semiconductor stacked structure including at least an electron transit layer and an electron supply layer over a substrate. The electron supply layer includes a first portion and second portions sandwiching the first portion, and the first portion has a higher energy of a conduction band than that of the second portion, and includes a doped portion doped with an n-type impurity and undoped portions that sandwich the doped portion and are not doped with an impurity.

13 Claims, 17 Drawing Sheets

(56) References Cited

U.S. PATENT DOCUMENTS

| | | | | |
|---|---|---|---|---|
| 5,313,093 | A * | 5/1994 | Nakagawa | H01L 29/0891 257/194 |
| 6,160,274 | A * | 12/2000 | Folkes | H01L 29/7787 257/191 |
| 6,281,528 | B1 * | 8/2001 | Wada | H01L 29/7785 257/192 |
| 6,479,842 | B1 * | 11/2002 | Kano | B82Y 10/00 257/15 |
| 2001/0005016 | A1 | 6/2001 | Bito et al. | |
| 2003/0141518 | A1 * | 7/2003 | Yokogawa | H01L 21/8252 257/194 |
| 2008/0023726 | A1 * | 1/2008 | Adesida | H01L 21/8252 257/194 |
| 2009/0008678 | A1 | 1/2009 | Ando et al. | |
| 2010/0270591 | A1 * | 10/2010 | Ahn | H01L 29/7782 257/194 |
| 2013/0105810 | A1 * | 5/2013 | Nishimori | H03F 3/189 257/76 |

FOREIGN PATENT DOCUMENTS

| | | |
|---|---|---|
| JP | 2001-177089 | 6/2001 |
| JP | 2003-324110 | 11/2003 |
| JP | 2004-221101 | 8/2004 |
| JP | 2005-302861 | 10/2005 |
| JP | 2007-048933 | 2/2007 |
| JP | 2007-73659 | 3/2007 |
| JP | 2011-199051 | 10/2011 |

OTHER PUBLICATIONS

JPOA—Office Action for the Japanese Patent Application No. 2015-506391 dated Jul. 12, 2016, with partial English translation.

EESR—The Extended European Search Report issued for European Patent Application No. 13878857.5 dated Oct. 11, 2016.

JPOA—Office Action for Japanese Patent Application No. 2015-506391 dated Dec. 6, 2016, with full machine translation.

* cited by examiner

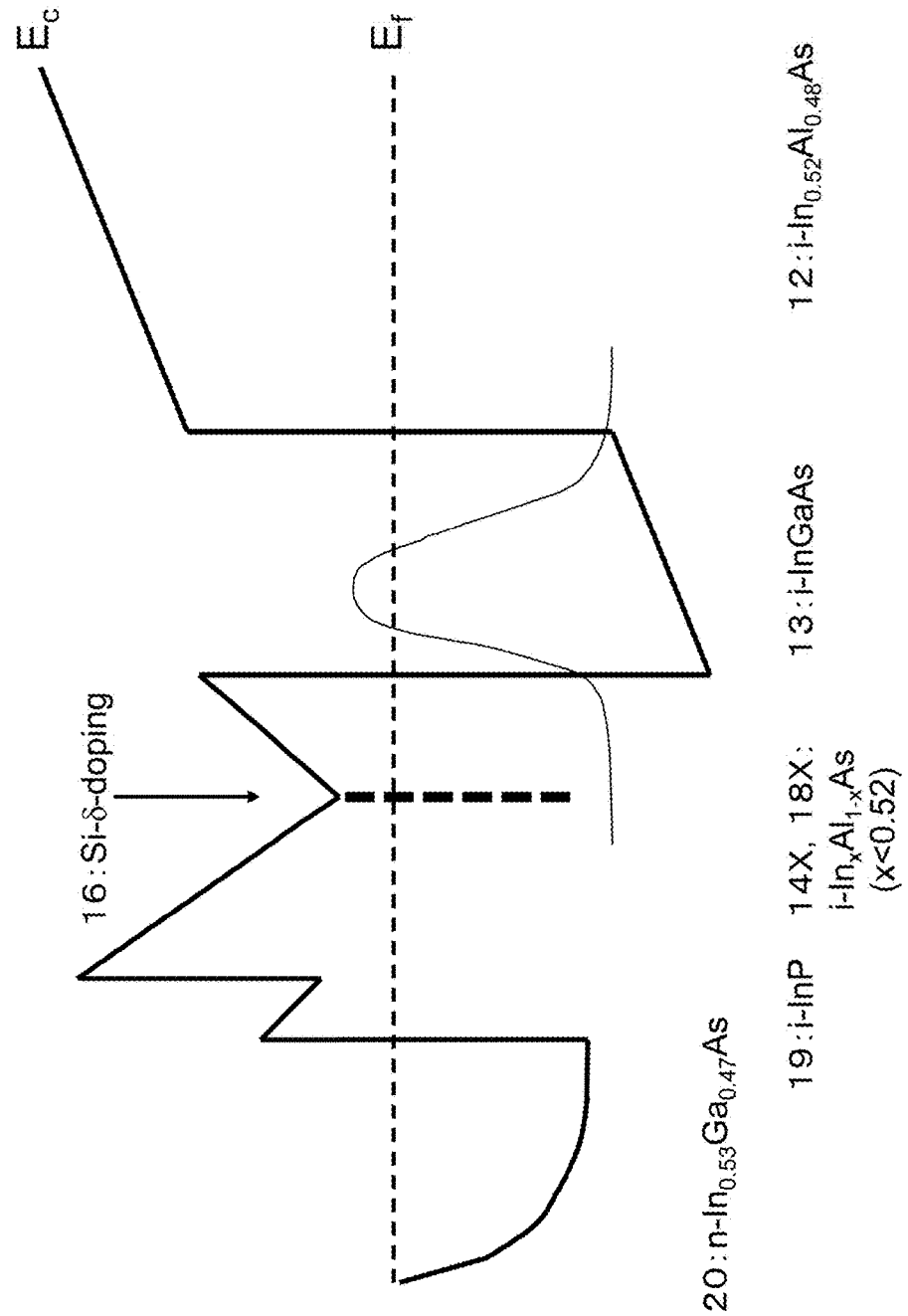

ured in a region (first portion) of the electron supply layer that

SEMICONDUCTOR DEVICE WITH ELECTRON SUPPLY LAYER

CROSS-REFERENCE TO RELATED APPLICATION

This application is a continuation application of International Application PCT/JP2013/057658 filed on Mar. 18, 2013 and designated the U.S., the entire contents of which are incorporated herein by reference.

FIELD

The embodiments discussed herein are related to a semiconductor device.

BACKGROUND

Conventionally, a semiconductor device is available which includes a semiconductor stacked structure including an electron transit layer and an electron supply layer provided over a substrate.

In such a semiconductor device as just described, since an n-type impurity is doped in the electron supply layer that functions also as a barrier layer, energy of a conduction band sometimes drops at the portion at which the n-type impurity is doped and a channel by which electrons are conducted is formed also in the electron supply layer. In particular, a situation in which electrons are conducted in the electron supply layer other than the electron transit layer, namely, so-called parallel conduction, sometimes occurs.

Since a channel in the electron supply layer by which electrons are conducted has an electron mobility and an electronic speed lower than those in the electron transit layer, if a channel by which electrons are conducted is formed in the electron supply layer, namely, if the parallel conduction occurs, then degradation in characteristic is caused.

Thus, a technology is available that, by setting a composition of Al in a region in which an n-type impurity is to be doped higher than a composition of Al in a non-doped region, for example, in an AlGaN barrier layer, energy of the conduction band of the region in which the n-type impurity is to be doped is increased and decrease of the energy of the conduction band arising from doping with the n-type impurity is compensated for. This is referred to as first technology.

It is to be noted that also a configuration is available that an InAlAs layer having a high composition of Al is provided on the opposite sides across an InAlAs electron supply layer in which the n-type impurity is doped entirely.

SUMMARY

The present semiconductor device includes a semiconductor stacked structure including at least an electron transit layer and an electron supply layer over a substrate, wherein the electron supply layer includes a first portion and second portions sandwiching the first portion, and the first portion has a higher energy of a conduction band than that of the second portion, and includes a doped portion doped with an n-type impurity and undoped portions that sandwich the doped portion and are not doped with an impurity.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a schematic view depicting a conduction band structure of the semiconductor device (InAlAs/InGaAs-based HEMT; InP-based HEMT) of the second comparative example.

DESCRIPTION OF EMBODIMENTS

Incidentally, it seems a possible idea to increase, for example, energy of the conduction band of the overall electron supply layer in order to suppress the parallel conduction described above. However, if the energy of the conduction band of the overall electron supply layer is increased, then tunnel current and thermal current of electrons decrease and contact resistance (ohmic contact resistance) of the source electrode and the drain electrode increases and besides the delay time period by parasitic resistance increases. Consequently, a characteristic is degraded.

Further, in the first technology described above, in order to compensate for decrease of energy of the conduction band caused by doping of an n-type impurity, the composition of Al of the overall region in which the n-type impurity is to be doped is increased to increase the energy of the conduction band of the overall region. However, the countermeasure just described is insufficient to suppress degradation in characteristic arising from increase of the delay time period by increase of the ohmic contact resistance described above. Further, there is the possibility that the n-type impurity may be dispersed from the region in which the n-type impurity is doped to the non-doped region and the energy of the conduction band in a boundary portion between the n-type impurity doped region and the non-doped region may decrease and then a channel by which electrons are conducted may be formed at the boundary portion to cause parallel conduction to degrade a characteristic.

Therefore, it is desirable to suppress parallel conduction and suppress degradation of a characteristic by the parallel conduction while degradation of a characteristic caused by increase of a delay time period by increase of ohmic contact resistance is sufficiently suppressed.

In the following, a semiconductor device according to an embodiment is described with reference to FIGS. 1 to 9 of the drawings.

The semiconductor device according to the present embodiment includes an InP-based high electron mobility transistor (HEMT) that is one of ultra-high-speed transistors used, for example, for communication. In particular, the present semiconductor device includes an InP-based HEMT having a semiconductor stacked structure in which an InAlAs/InGaAs-based compound semiconductor is used, for example, on an InP substrate. The InP-based HEMT is a transistor capable of operating in a region of, for example, a millimeter wave (approximately 30 to approximately 300 GHz) or a submillimeter wave (approximately 300 GHz to approximately 3 THz). It is to be noted that the InAlAs/InGaAs-based compound semiconductor is referred to sometimes as III-V group compound semiconductor. Further, the InP-based HEMT is referred to sometimes as InAlAs/InGaAs-based HEMT.

Figure 1:
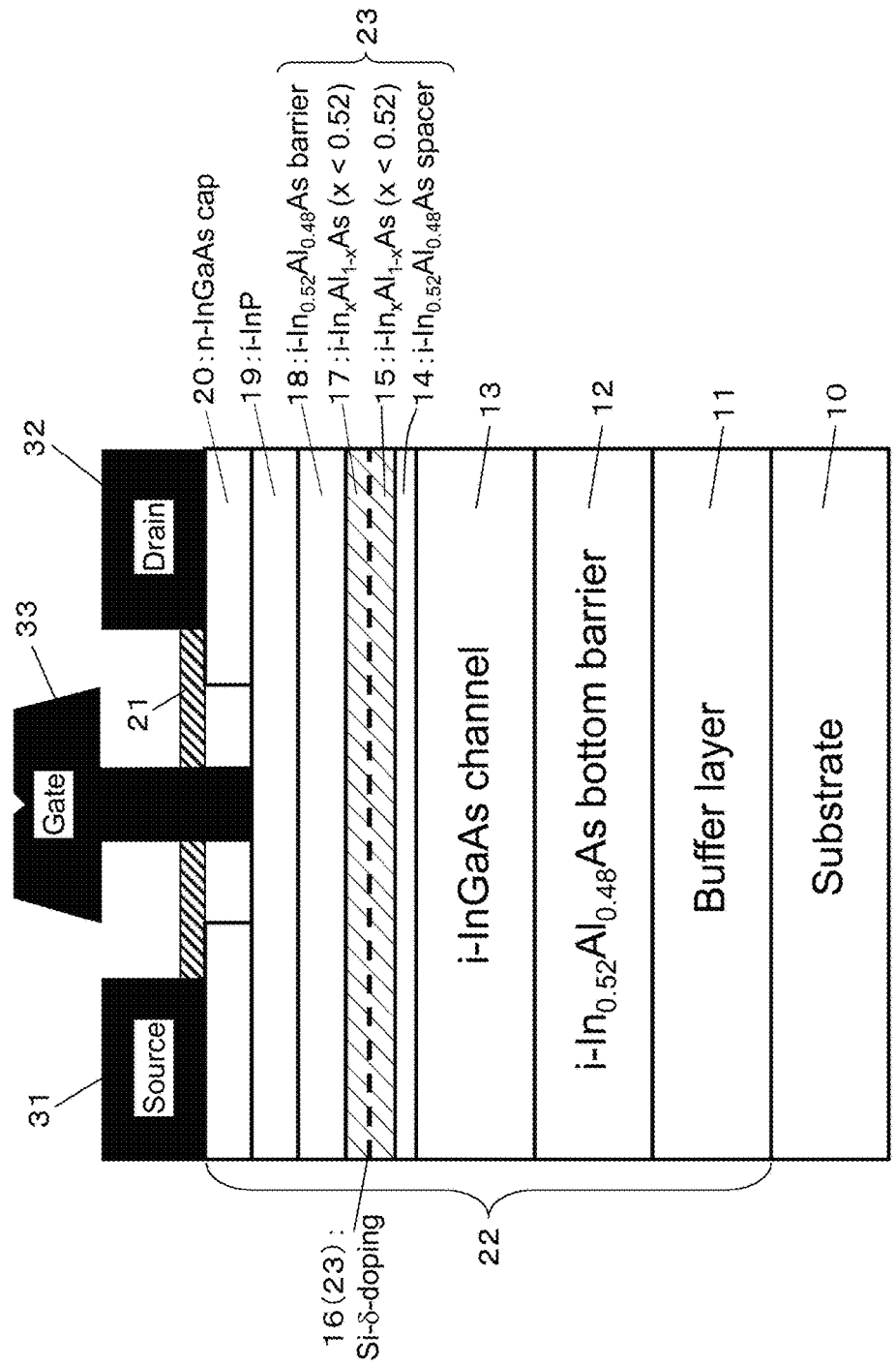
FIG. 1 is a schematic sectional view depicting a configuration of a semiconductor device (InAlAs/InGaAs-based HEMT; InP-based HEMT) of a present embodiment.

As depicted in FIG. 1, the present InP-based HEMT includes a substrate 10, a semiconductor stacked structure 22 provided on the substrate 10, and a gate electrode 33, a source electrode 31 and a drain electrode 32 provided on the semiconductor stacked structure 22.

In the present embodiment, the substrate 10 is a semi-insulating InP substrate (semiconductor substrate). It is to be noted that, as the substrate 10, also a GaAs substrate or an Si substrate can be used.

The semiconductor stacked structure 22 is a semiconductor stacked structure including an electron transit layer (channel layer) 13 and an electron supply layer (barrier layer) 23. Here, the semiconductor stacked structure 22 has a structure that a buffer layer 11, a lower barrier layer 12, the electron transit layer 13, the electron supply layer 23, an etching stopping layer 19 and a cap layer 20 are stacked in order.

In the present embodiment, the buffer layer 11 has a thickness of, for example, approximately 1000 nm. It is to be noted that a material to be used for the buffer layer 11 is different depending upon the substrate 10.

The lower barrier layer 12 is an InAlAs layer. Here, the lower barrier layer 12 is an undoped InAlAs layer. For example, the lower barrier layer 12 is an i-$In_{0.52}Al_{0.48}As$ layer and has a thickness of approximately 200 nm.

The electron transit layer 13 is an InGaAs layer. In particular, the electron transit layer 13 includes InGaAs. Here, the electron transit layer 13 is an undoped InGaAs layer. For example, the electron transit layer 13 is an i-$In_{0.53}Ga_{0.47}As$ layer and has a thickness of approximately 10 nm. It is to be noted that an $In_{0.53}Ga_{0.47}As$ layer that lattice-matches with InP may not be used as the electron transit layer 13, and the InAs composition may be increased so as to be higher than 0.53 as in an $In_{0.7}Ga_{0.3}As$ layer to which compression distortion is applied or the like.

The electron supply layer 23 has a structure that an InAlAs spacer layer 14, an InAlAs layer 15, an Si-δ doped layer 16, an InAlAs layer 17 and an InAlAs barrier layer 18 are stacked in order. Here, the electron supply layer 23 has a structure that an undoped InAlAs spacer layer 14, an undoped InAlAs layer 15, an Si-δ doped layer 16 δ-doped with Si that is an n-type impurity, an undoped InAlAs layer 17 and an undoped InAlAs barrier layer 18 are stacked in order. For example, the electron supply layer 23 has a structure that an i-$In_{0.52}Ga_{0.48}As$ spacer layer 14 having a thickness of approximately 2 nm, an i-$In_{0.4}Ga_{0.6}As$ layer 15 having a thickness of approximately 1 nm, an Si-δ doped layer 16 in which the δ doping amount of Si is approximately $1\times10^{13}$ cm$^{-2}$, an i-$In_{0.4}Ga_{0.6}As$ layer 17 having a thickness of approximately 1 nm and an i-$In_{0.52}Ga_{0.48}As$ barrier layer 18 having a thickness of approximately 5 nm are stacked in order.

It is to be noted that, while the InAlAs layers 15 and 17 that sandwich the Si-δ doped layer 16, namely, InAlAs layers for which δ doping is to be performed, are i-$In_{0.4}Ga_{0.6}As$ layers here, the InAlAs layers are not limited to this, and i-$In_xAl_{1-x}As$ (x<0.52) layers may be used. In particular, the InAlAs layers 15 and 17 may formed so as to have a higher composition of Al (AlAs composition) than that of the InAlAs spacer layer 14 and the InAlAs barrier layer 18 that sandwich the InAlAs layers 15 and 17.

Further, the Si-σ doped layer 16 is configured by forming an element (here, Si) to be used as an n-type impurity as a very thin film having a thickness equal to or thinner than a one-atom layer without supplying, upon crystal growth of InAlAs, a III group element and a V group element. The Si-δ doped layer 16 and the InAlAs layers 15 and 17 sandwiching the Si-δ doped layer 16 can be entirely considered as a layer in which an element (here, Si) to be used as an n-type impurity is planar-doped between the InAlAs layers. The Si-δ doped layer 16 is referred to sometimes as n-type impurity doped layer, n-type impurity planar-doped layer, n-type impurity layer or n-type impurity atom layer. In this manner, an n-type impurity is not doped uniformly but is σ-doped, namely, planar-doped, into a region in which the energy of the conduction band is increased by increasing the Al composition of the InAlAs configuring the electron supply layer 23. By the δ doping, the n-type impurity is doped partially into the region in which the energy of the conduction band is increased by increasing the Al composition of InAlAs. This is effective to form, when a gate length $L_g$ is to be refined in order to achieve increase of the speed of the HEMT, the electron supply layer between the gate electrode and the electron transit layer as thin as possible in accordance with the refinement of the gate length $L_g$ from a view point of scaling.

Further, the InAlAs layer 15, Si-δ doped layer 16 and InAlAs layer 17 are referred to sometimes as first portion. Further, the InAlAs spacer layer 14 and the InAlAs barrier layer 18 are referred to as second portion. In this case, the electron supply layer 23 has the first portion and the second portions that sandwich the first portion, and the first and second portions individually contain InAlAs, namely, the first and second portions individually contain Al, and besides the first portion has a composition of Al higher than that of the second portions. Therefore, the first portion is higher in energy of the conduction band than the second portion. In this manner, the first portion and the second portions that configure the electron supply layer 23 contain the same semiconductor material but have compositions different from each other. Further, since the Si-δ doped layer 16 is a portion δ-doped with Si as an n-type impurity, the Si-δ doped layer 16 is referred to sometimes as doped portion doped with an n-type impurity or as doped portion planar-doped with an n-type impurity. Further, since the InAlAs layers 15 and 17 sandwiching the Si-δ doped layer 16, namely, the InAlAs layers to which δ doping is to be performed, are undoped InAlAs layers, the InAlAs layers 15 and 17 are referred to sometimes as undoped portion not doped with an impurity. In this case, the first portion includes a doped portion doped with an n-type impurity and undoped portions that sandwich the doped portion and are not doped with an impurity. Further, since the InAlAs spacer layer 14 and the InAlAs barrier layer 18 are undoped InAlAs layers, the second portions are not doped with an impurity.

In this manner, in the present embodiment, InAlAs is used for the electron supply layer 23 and the Al composition of an intermediate portion (inner side portion) sandwiched by the upper side portion and the lower side portion (outer side portions) is increased to increase the energy of the conduction band of the intermediate portion. In particular, the portion at which the energy of the conduction band is increased by increasing the Al composition is sandwiched by the portions that have an Al composition and energy of the conduction band lower than those of the portion to be sandwiched. Further, planar doping (δ doping) of an n-type impurity is performed for the central position in the thicknesswise direction of the intermediate portion having high energy of the conduction band. In particular, the portion planar-doped with the n-type impurity is sandwiched by the portions that have high energy of the conduction band and are not doped with an impurity. In this manner, the region in which the energy of the conduction band is high is provided partially within the electron supply layer 23 and an n-type impurity is doped partially in the region in which the energy of the conduction band is high. Consequently, the portion doped with the n-type impurity is sandwiched by the portions that have high energy of the conduction band and are not doped with an impurity, and the portions that have high energy of the conduction band and are not doped with an impurity are sandwiched by the portions that have energy of the conduction band lower than that of the portions and are not doped with an impurity.

It is to be noted that, while InAlAs is used as a semiconductor material configuring the layers of the electron supply layer 23 here, the semiconductor material is not limited to this and, for example, InAlAsSb may be used.

The etching stopping layer 19 is an InP layer and is an etching stopping layer for the cap layer 20. Here, the etching stopping layer 19 is an undoped InP layer, namely, an i-InP layer and has a thickness of approximately 3 nm. It is to be noted the etching stopping layer 19 has also a function as a protective layer for preventing oxidation of an InAlAs electron supply layer.

The cap layer 20 is an InGaAs layer. Here, the cap layer 20 is an n-InGaAs layer in which Si is doped to provide an n-type conductivity. For example, the cap layer 20 is an n-$In_{0.53}Ga_{0.47}As$ layer, and has a thickness of approximately 20 nm and has an Si doping amount of approximately $2 \times 10^{19}$ cm$^{-3}$. It is to be noted that the cap layer 20 may be configured as a cap layer having a two-layer structure formed by stacking an n-$In_{0.70}Ga_{0.30}As$ layer on an n-$In_{0.53}Ga_{0.47}As$ layer. Further, the cap layer 20 may be configured as a cap layer having a two-layer structure formed by stacking an n-type InGaAs layer and an n-type InAlAs layer.

The conduction band structure of the semiconductor stacked structure 22 configured in such a manner as described above is depicted in FIG. 2. It is to be noted that, in FIG. 2, a thin dotted line indicates a Fermi level $E_f$ and a thick dotted line indicates that the portion is Si-δ-doped, and a waveform in an InGaAs channel layer indicates an electron distribution.

It is to be noted that the semiconductor stacked structure 22 may include at least the electron transit layer 13 and the electron supply layer 23 over the substrate 10 and may include a different stacked structure. Further, the semiconductor stacked structure 22 is referred to sometimes as hetero structure semiconductor layer.

The gate electrode 33, source electrode 31 and drain electrode 32 are provided on the semiconductor stacked structure 22 configured in such a manner as described above, and the surface of the semiconductor stacked structure 22 is covered with an SiO$_2$ film (insulating film) 21.

Here, the source electrode 31 and the drain electrode 32 configured, for example, from Ti/Pt/Au are provided on the n-InGaAs cap layer 20. Further, the gate electrode 33 configured, for example, from Ti/Pt/Au is provided on the i-InP layer 19.

Incidentally, the reason why the electron supply layer 23 in the present embodiment is configured as described above is described below.

Figure 3:
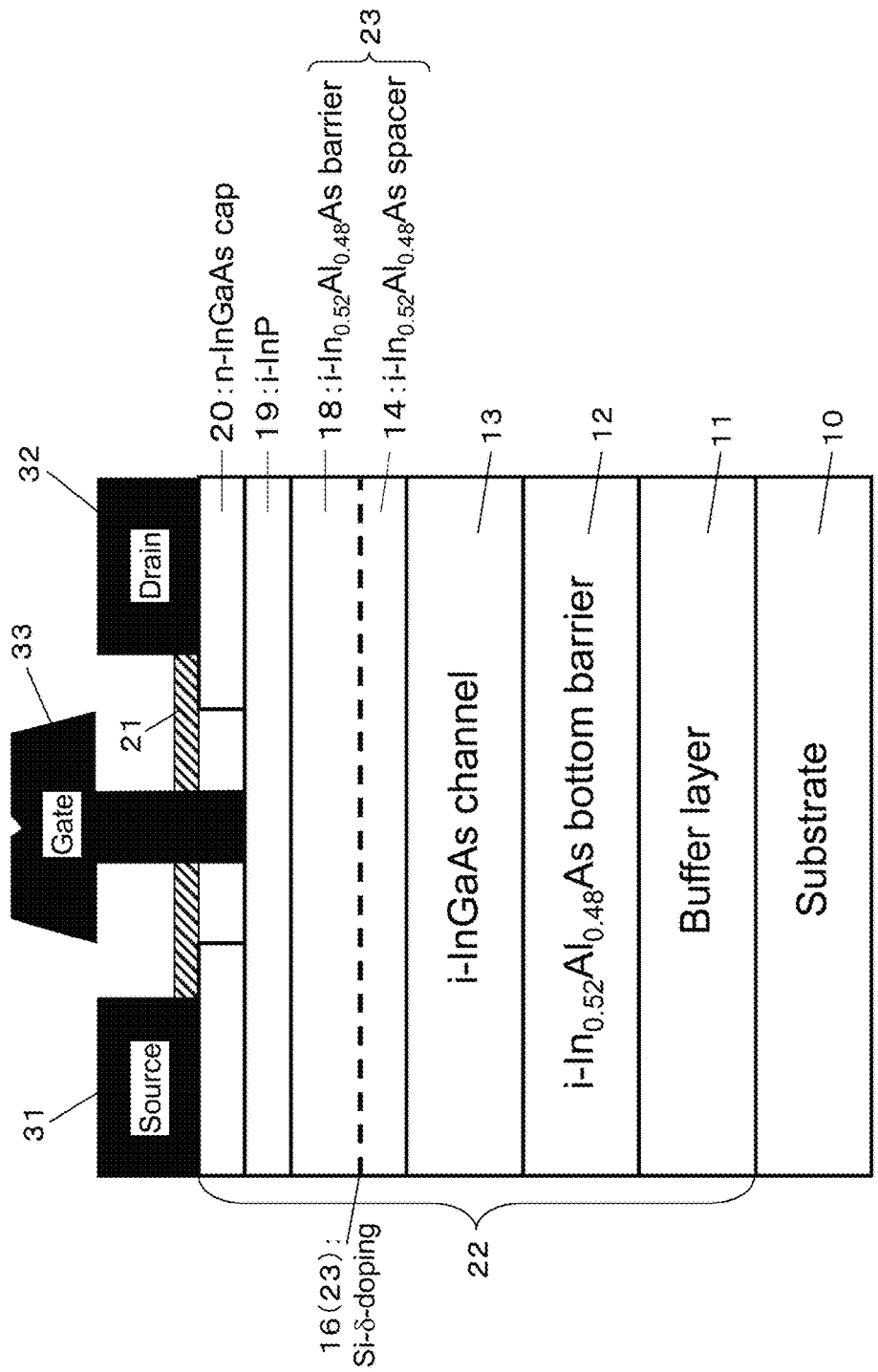
FIG. 3 is a schematic sectional view depicting a configuration of a semiconductor device (InAlAs/InGaAs-based HEMT; InP-based HEMT) of a first comparative example.

For example, the electron supply layer 23 has a structure that an i-$In_{0.52}Ga_{0.48}As$ spacer layer 14, an Si-δ doped layer 16 and an i-$In_{0.52}Ga_{0.48}As$ barrier layer 18 are stacked in order as depicted in FIG. 3. This configuration is referred to as first comparative example. It is to be noted that, in this case, the thickness of the i-$In_{0.52}Ga_{0.48}As$ spacer layer 14 is approximately 3 nm and the thickness of the i-$In_{0.52}Ga_{0.48}As$ barrier layer 18 is approximately 6 nm, and the thickness of the overall electron supply layer is equal to that of the embodiment described above.

Figure 4:
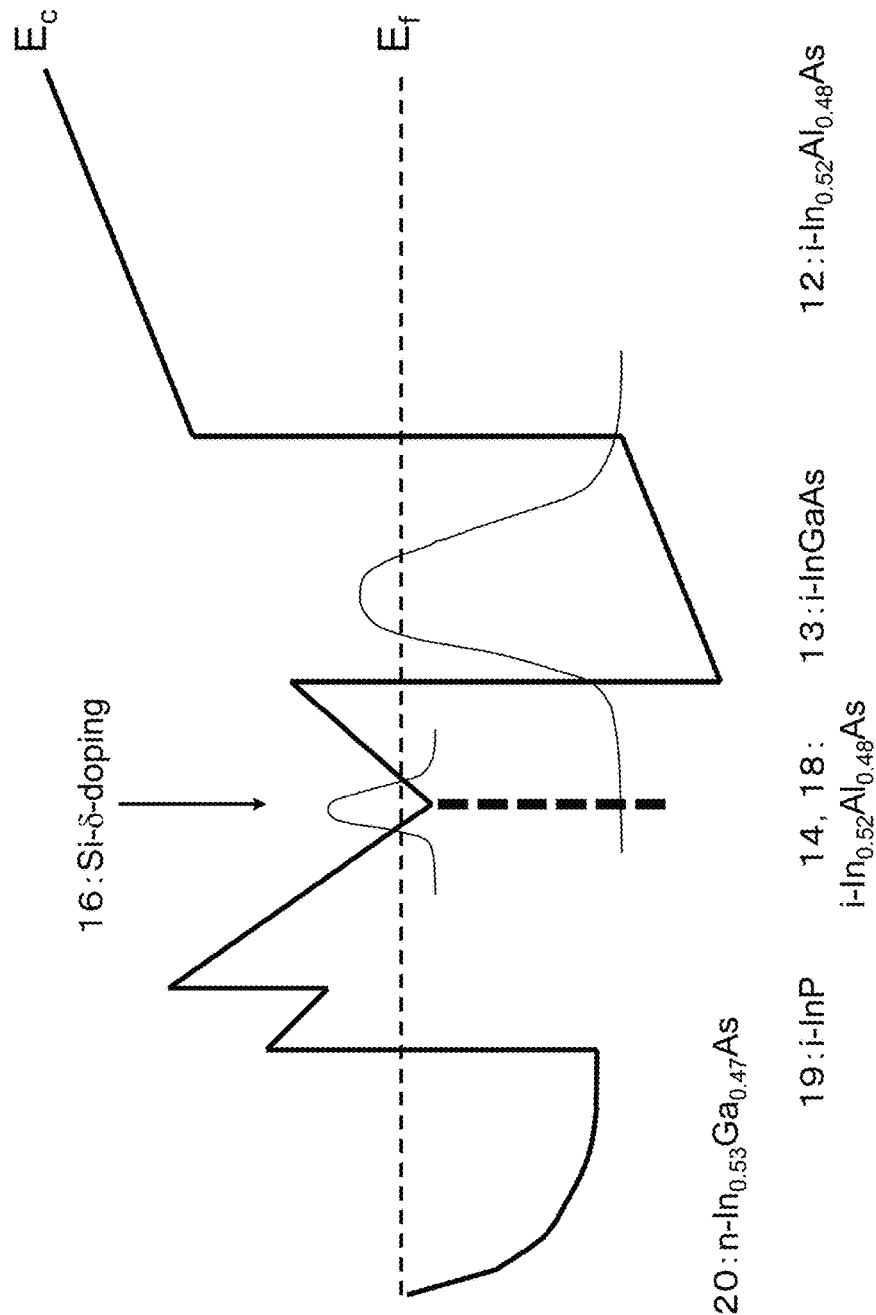
FIG. 4 is a schematic view depicting a conduction band structure of the semiconductor device (InAlAs/InGaAs-based HEMT; InP-based HEMT) of the first comparative example.

In this case, for example, as depicted in FIG. 4 in which a conduction band structure is depicted, a band discontinuity amount $\Delta E_c$ of a conduction band $E_c$ between the electron supply layer 23 and the electron transit layer 13 does not increase very much. Further, since the Si-δ doped layer 16 doped with an n-type impurity is provided on the electron supply layer 23 that functions as a barrier layer, the energy of the conduction band at the portion sometimes decreases, resulting in formation of a channel in which electrons are conducted also in the electron supply layer 23. In particular, the energy of the conduction band $E_c$ of the δ doped portion in the electron supply layer 23, namely, of the Si-δ doped layer 16 sandwiched by the i-$In_{0.52}Ga_{0.48}As$ spacer layer 14 and the i-$In_{0.52}Ga_{0.48}As$ barrier layer 18 configuring the electron supply layer 23, decreases sharply and the energy of the conduction band $E_c$ of the δ doped portion becomes equal to or lower than the Fermi energy $E_f$. Then, a channel in which electrons are conducted is formed also at the δ doped portion, and electrons are sometimes conducted also in the electron supply layer 23 other than the electron transit layer 13, namely, so-called parallel conduction sometimes occurs. It is to be noted that, in FIG. 4, a thin dotted line indicates a Fermi level $E_f$ and a thick dotted line indicates that the portion is Si-δ-doped, and a waveform indicates an electron distribution.

The channel in the electron supply layer 23 in which electrons are conducted, namely, the δ-doped portion, has an electron mobility and an electron speed lower than those in the electron transit layer 13. This is because the δ-doped portion is an InAlAs layer in which the effective mass of electrons is heavy and that ionization impurity diffusion is great. Therefore, if a channel in which electrons are conducted is formed in the electron supply layer 23, namely, if parallel conduction occurs, then degradation of a characteristic is caused. For example, if parallel conduction occurs, then the overall delay time period is influenced not only by electrons in the electron transit layer 13 but also by electrons of the δ-doped portion increases the value thereof, and this causes degradation of a characteristic of the cutoff frequency or the like. Accordingly, parallel conduction in the electron supply layer 23 that functions as a barrier layer is desired to be suppressed as far as possible without having an influence on some other delay time period or the like.

Figure 5:
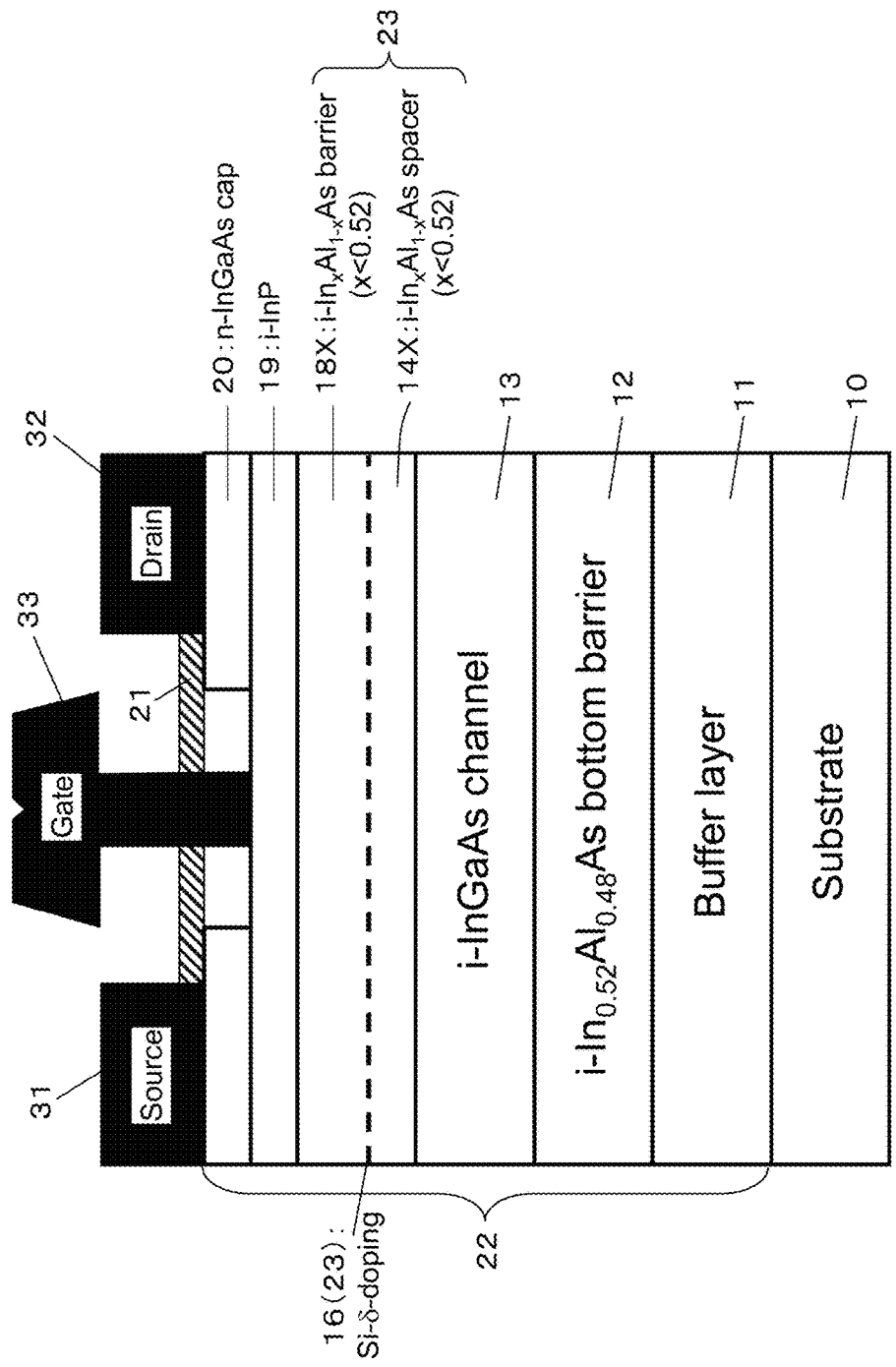
FIG. 5 is a schematic sectional view depicting a configuration of a semiconductor device (InAlAs/InGaAs-based HEMT; InP-based HEMT) of a second comparative example.

It seems a possible idea to generally increase, in order to suppress such parallel conduction as described above, the Al composition of InAlAs configuring the electron supply layer 23 to increase the energy of the conduction band $E_c$ of the entire electron supply layer, namely, to increase the band discontinuity amount of the conduction band $E_c$ of the electron supply layer 23 and the electron transit layer 13. For example, it seems a possible idea to configure the electron supply layer 23 so as to have a structure that, as depicted in FIG. 5, an i-$In_xAl_{1-x}As$ (x<0.52) spacer layer 14X (for example, an i-$In_{0.4}Al_{0.6}As$ spacer layer), an Si-δ doped layer 16 and an i-$InAl_{1-x}As$ (x<0.52) barrier layer 18X (for example, an i-$In_{0.4}Al_{0.6}As$ barrier layer) are stacked in order, namely, such a conduction band structure as depicted in FIG. 6 to suppress parallel conduction. This is referred to as second comparative example. It is to be noted that the i-$In_xAl_{1-x}As$ (x<0.52) spacer layer 14X (for example, an i-$In_{0.4}Al_{0.6}As$ spacer layer) and the i-$In_xAl_{1-x}As$ (x<0.52) barrier layer 18X (for example, an i-$In_{0.4}Al_{0.6}As$ barrier layer) are same as those in the case of the first comparative example described above. It is to be noted that, in FIG. 6, a thin broken line indicates a Fermi level $E_f$ and a thick broken line indicates that the portion is Si-δ-doped, and a waveform in an InGaAs channel layer indicates an electron distribution.

However, if the energy of the conduction band $E_c$ of the electron supply layer 23 is increased entirely in this manner, then tunnel current and thermal current decrease and the contact resistance (ohmic contact resistance; contact resistance) of the source electrode 31 and drain electrode 32 increases and besides the delay time period of parasitic resistance increases, and this degrades a characteristic. For example, if the ohmic contact resistance increases and the delay time period by parasitic resistance increases, then a high-frequency characteristic value (for example, a cutoff frequency $f_T$, a maximum oscillation frequency $f_{max}$ or the like) decreases. It is to be noted that the tunnel current is generated by passing of electrons in the electron supply layer 23 by a quantum-mechanical tunnel effect. Further, the thermal current is generated by electrons that exceed a high barrier by thermal energy.

Figure 2:
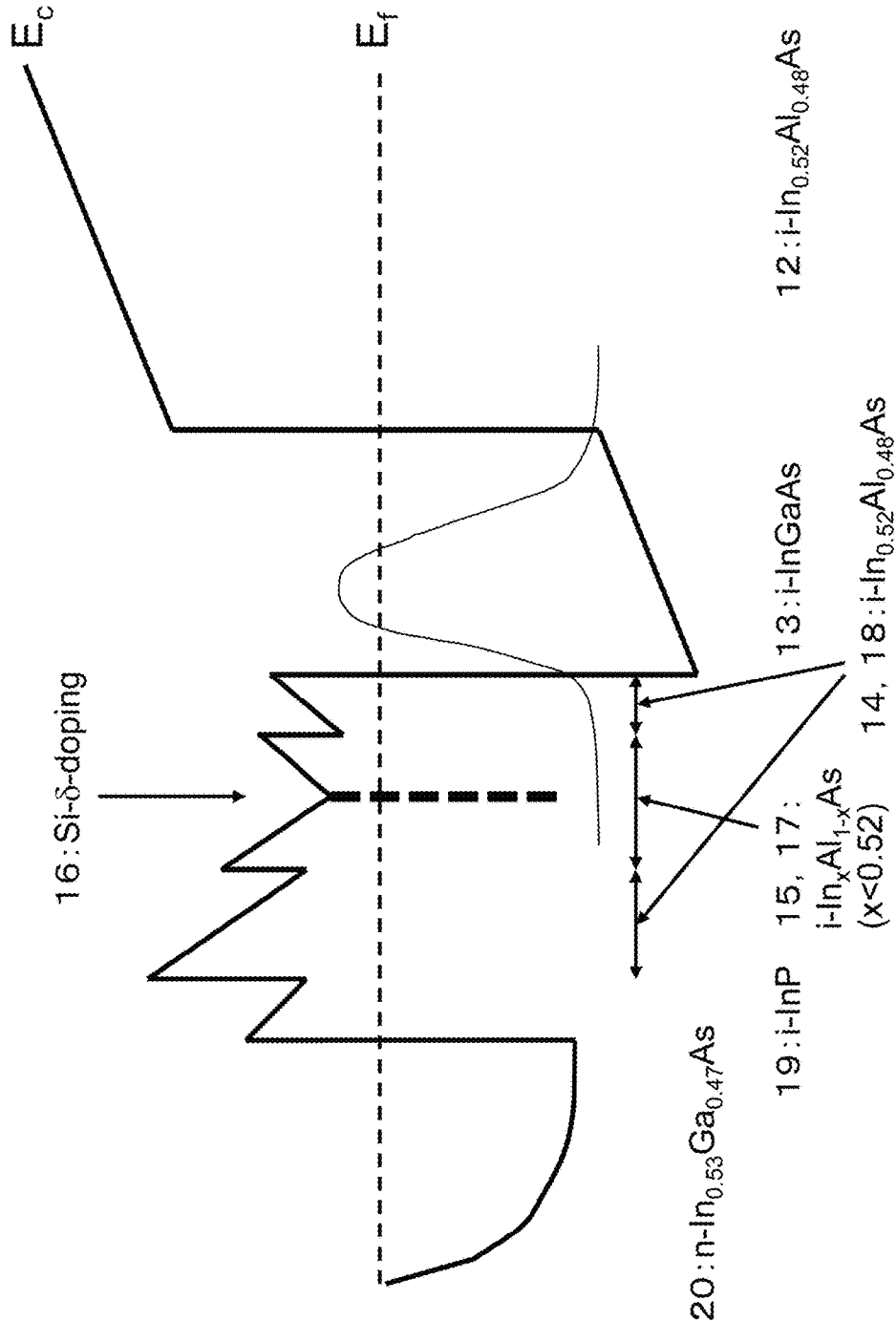
FIG. 2 is a schematic view depicting a conduction band structure of the semiconductor device (InAlAs/InGaAs-based HEMT; InP-based HEMT) of the present embodiment.

Therefore, in the present embodiment, the Al composition of InAlAs configuring the electron supply layer 23 is partially increased only in the proximity of the δ doped portion as described above to increase the energy of the conduction band $E_c$ of the electron supply layer 23 partially only in the proximity of the δ doped portion (refer to FIG. 2). Here, an $In_xAl_{1-x}As$ layer (x<0.52; for example, x=approximately 0.4) is provided over and under the δ doped portion in the i-$In_{0.52}Al_{0.48}As$ layer configuring the electron supply layer 23 so that the Al composition (AlAs composition) in the electron supply layer 23 is increased stepwise only in the proximity of the δ doped portion. In this case, the electron supply layer 23 has a structure that the i-$In_{0.52}Al_{0.48}As$ spacer layer 14, an i-$In_xAl_{1-x}As$ (x<0.52) layer 15 (for example, an i-$In_{0.4}Al_{0.6}As$ layer), the Si-δ doped layer 16, an i-$In_xAl_{1-x}As$ (x<0.52) layer 17 (for example, an i-$In_{0.4}Al_{0.6}As$ layer) and the i-$In_{0.52}Al_{0.48}As$ barrier layer 18 are stacked in order.

Consequently, as indicated by the conduction band structure of FIG. 2, the energy of the conduction band $E_c$ does not decrease so much at the δ doped portion and in the proximity of the δ doped portion as that in the first comparative example (refer to FIG. 4) described above and parallel conduction in which the δ doped portion functions as a channel in which electrons are conducted can be suppressed. In other words, the energy of the conduction band at the δ doped portion and in the proximity of the δ doped portion does not drop to a level equal to or lower than the Fermi energy $E_f$, and parallel conduction in which the δ doped portion functions as a channel in which electrons are conducted can be suppressed. Therefore, degradation of a characteristic by parallel conduction can be suppressed. For example, as regards the electron distribution, while electrons of approximately 10% can exist in the electron supply layer 23 in the first comparative example (refer to FIG. 4) described above, in the present embodiment, the ratio of electrons existing in the electron supply layer 23 can be decreased to substantially 0%. Further, since also the energy of the conduction band $E_c$ of the entire electron supply layer does not increase so much as that of the second comparative example (refer to FIG. 6) described above, increase of the ohmic contact resistance of the source electrode 31 and the drain electrode 32 can be suppressed. Consequently, degradation of a characteristic arising from increase of the delay time period by increase of the ohmic contact resistance can be suppressed.

Furthermore, since only the energy of the conduction band $E_c$ of the electron supply layer 23 is increased partially, degradation of a characteristic arising from increase of the delay time period by increase of the ohmic contact resistance can be sufficiently suppressed. In contrast, in the conventional technology (first technology described above), in order to compensate for decrease of energy of the conduction band $E_c$ caused by doping of an n-type impurity, the Al composition in the region to be doped with an n-type impurity is increased entirely to increase the energy of the conduction band $E_c$ in the overall region. Therefore, it is not sufficient to suppress degradation of a characteristic arising from increase of the delay time period by increase of the ohmic contact resistance described above. In this manner, in comparison with the conventional technology (first technology described), by applying the configuration described above as in the present embodiment, the energy of the conduction band at the portion doped with an n-type impurity and in the proximity of the portion decreases. Therefore, degradation of a characteristic arising from increase of the delay time period by increase of the ohmic contact resistance can be sufficiently suppressed. For example, by applying the configuration described as in the present embodiment, in comparison with the conventional technology (first technology described above), the ohmic contact resistance decreases and the delay time period by parasitic resistance reduces and the high-frequency characteristic value (for example, the cutoff frequency $f_T$, maximum oscillation frequency $f_{max}$ or the like) increases.

Further, an n-type impurity is only doped partially into the portion at which the energy of the conduction band $E_c$ on the electron supply layer 23 has been increased. In particular, an impurity is not doped in the upper and lower portions sandwiching the δ doped portion, namely, in the portions other than the δ doped portion of the portion in which the energy of the conduction band $E_c$ has been increased. Therefore, it can be suppressed that an n-type impurity is dispersed from the δ doped portion to the upper and lower portions (spacer layer 14 and barrier layer 18) sandwiching the portion at which the energy of the conduction band $E_c$ has been increased. Therefore, it can be suppressed that the energy of the conduction band $E_c$ in the upper and lower portions (spacer layer 14 and barrier layer 18) sandwiching the portion at which the energy of the conduction band $E_c$ has been increased decreases and the energy of the conduction band $E_c$ at the boundary portion between the portion at which the energy of the conduction band $E_c$ has been increased and the upper and lower portions (spacer layer 14 and barrier layer 18) sandwiching the portion decreases, resulting in formation of a channel in which electrons are conducted at the boundary portion and occurrence of parallel conduction to degrade a characteristic. On the other hand, in the conventional technology (first technology described above), there is the possibility that an n-type impurity may be dispersed from the region in which an n-type impurity is doped to the non-doped region and the energy of the conduction band $E_c$ in the non-doped region may decrease to decrease the energy of the conduction band $E_c$ at the boundary portion between the n-type impurity doped region and the non-doped region and form a channel in which electrons are conducted at the boundary portion, resulting in occurrence of parallel conduction to degrade a characteristic. It is to be noted that the structure of the present embodiment that the δ doped portion having a thickness equal to or smaller than a one-atom layer is sandwiched by the undoped portions and the structure of the conventional technology (first technology described above) that an n-type impurity is doped uniformly in the overall layer having a high Al composition and a thickness of approximately 1 nm can be distinguished from each other, for example, depending upon secondary ion mass spectrometry (SIMS).

Then, a fabrication method for the semiconductor (InP-based HEMT; InAlAs/InGaAs-based HEMT) according to the present embodiment is described with reference to FIGS. 7 to 9.

Figure 7A:
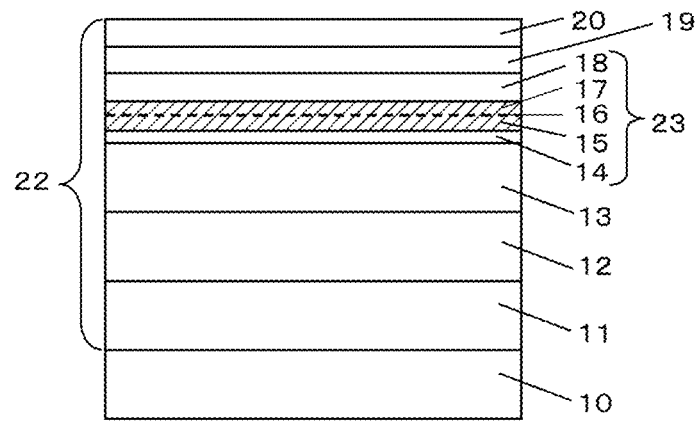
FIGS. 7A to 7C are schematic sectional views illustrating a fabrication method for the semiconductor device (InAlAs/InGaAs-based HEMT; InP-based HEMT) of the present embodiment.

First, as depicted in FIG. 7A, a buffer layer 11, an i-$In_{0.52}Al_{0.48}As$ layer 12, an i-InGaAs electron transit layer 13, and an i-$In_{0.52}Al_{0.48}As$ spacer layer 14, an i-$In_{0.4}Al_{0.6}As$ layer 15, an Si-δ doped layer 16, an i-$In_{0.4}Al_{0.6}As$ layer 17, and an i-$In_{0.52}Al_{0.48}As$ spacer layer 18, which are to configure the electron supply layer 23, as well as an i-InP etching stopping layer 19 and an n-$In_{0.53}Ga_{0.47}As$ cap layer 20 are stacked in order on the semi-insulation InP substrate 10, for example, by a molecular beam epitaxy (MBE) method to form a semiconductor stacked structure 22. It is to be noted that the crystal growth method is not limited to the MBE method, and, for example, also a metal organic chemical vapor deposition (MOCVD) method can be used.

Here, the buffer layer 11 has a thickness set to approximately 1000 nm. The i-$In_{0.52}Al_{0.48}As$ layer 12 has a thickness set to approximately 200 nm. Further, the i-InGaAs electron transit layer 13 has a thickness set to approximately 10 nm. Further, the i-$In_{0.52}Al_{0.48}As$ spacer layer 14 has a thickness set to approximately 2 nm. Further, the i-$In_{0.4}Al_{0.6}As$ layer 15 has a thickness set to approximately 1 nm. Further, the Si-δ doped layer 16 has a δ doping amount of Si set to approximately $1 \times 10^{13}$ $cm^{-2}$. Further, the i-$In_{0.4}Al_{0.6}As$ layer 17 has a thickness set to approximately 1 nm. Further, the i-$In_{0.52}Ga_{0.48}As$ barrier layer 18 has a thickness set to approximately 5 nm. Further, the i-InP etching stopping layer 19 has a thickness set to approximately 3 nm. Further, the n-$In_{0.53}Ga_{0.47}As$ cap layer 20 has a thickness set to approximately 20 nm and an Si doping amount set to approximately $2 \times 10^{19}$ $cm^{-3}$.

Figure 7B:
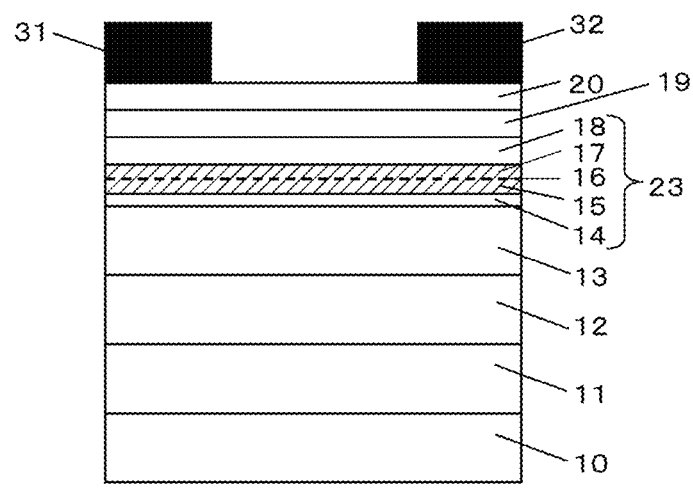

Then, after element isolation, a source electrode 31 and a drain electrode 32 individually having a three-layer structure, for example, of Ti/Pt/Au are formed as depicted in FIG. 7B. Consequently, the source electrode 31 and the drain electrode 32 are formed on the n-$In_{0.53}Ga_{0.47}As$ cap layer 20.

Figure 7C:
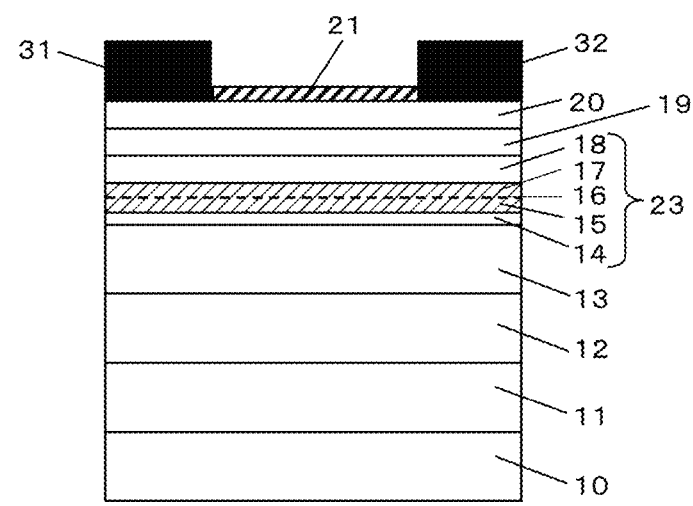

Then, an $SiO_2$ film 21 is formed on the n-$In_{0.53}Ga_{0.47}As$ cap layer 20 between the source electrode 31 and the drain electrode 32 as depicted in FIG. 7C, for example, by a plasma CVD (Chemical Vapor Deposition) method. Here, the $SiO_2$ film 21 has a thickness of approximately 20 nm.

Then, a T-shaped gate electrode 33 is formed as depicted in FIGS. 8A to 9C.

Figure 8A:
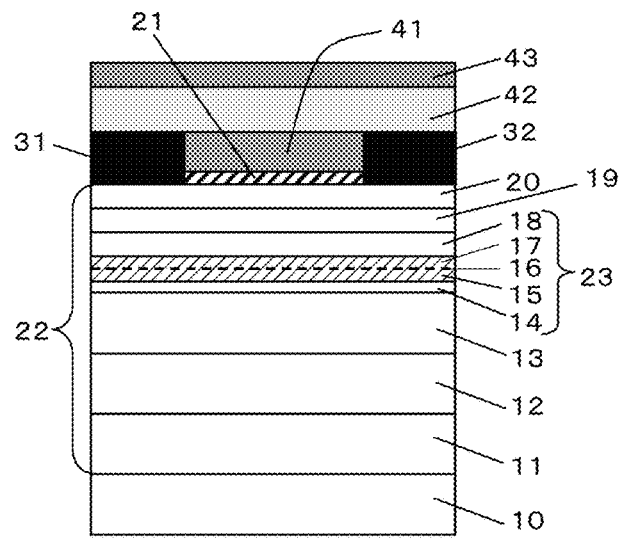
FIGS. 8A to 8C are schematic sectional views illustrating a fabrication method for the semiconductor device (InAlAs/InGaAs-based HEMT; InP-based HEMT) of the present embodiment.

In particular, resist films 41 to 43 having a three-layer structure are formed first as depicted in FIG. 8A. Here, a ZEP resist (by Zeon Corporation), a PMGI (Poly-dimethyl-glutarimide) resist and the ZEP resist are applied in order to form the resist films having a three-layer structure that a ZEP resist film 41, a PMGI resist film 42 and a ZEP resist film 43 are stacked in order.

Figure 8B:
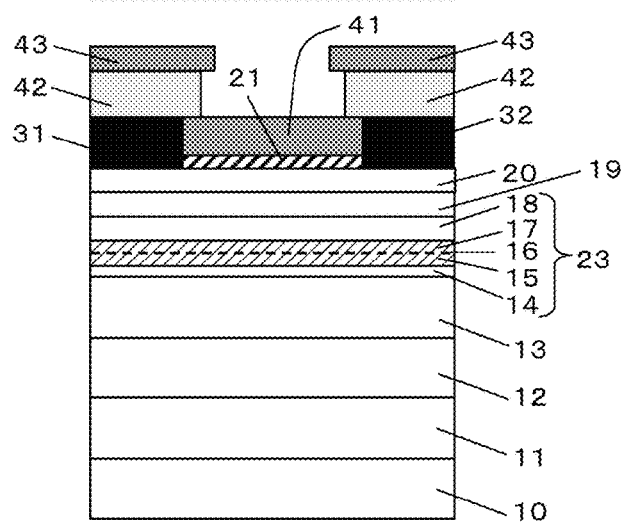
Figure 8C:
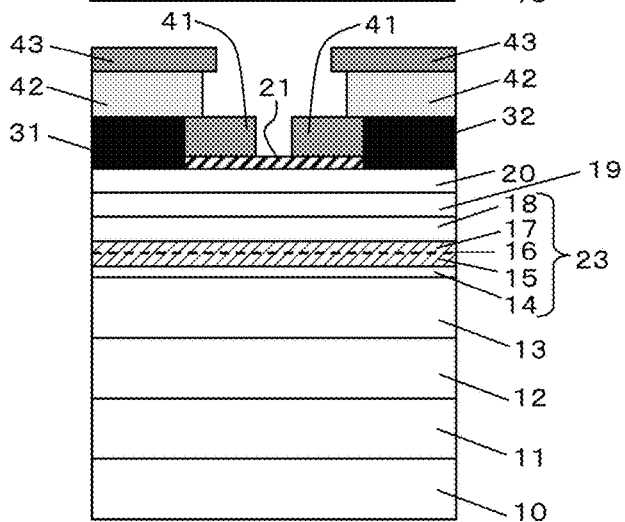

Then, for example, by an electron beam exposure method, a region in which a head portion of the T-shaped gate electrode 33 is to be formed is exposed to form an opening on the ZEP resist film 43 and the PMGI resist film 42 as depicted in FIG. 8B. Further, for example, by an electron beam exposure method, a region in which a foot portion of the T-shaped gate electrode 33 is to be formed is exposed to form an opening in accordance with a desired gate length on the ZEP resist film 41 of the lowest layer as depicted in FIG. 8C.

Figure 9A:
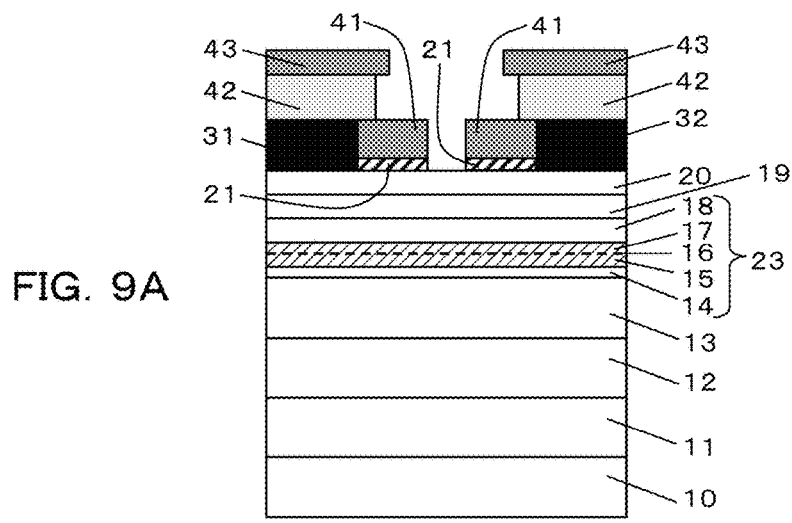
FIGS. 9A to 9C are schematic sectional views illustrating a fabrication method for the semiconductor device (InAlAs/InGaAs-based HEMT; InP-based HEMT) of the present embodiment.

Then, an opening is formed in the $SiO_2$ film 21 as depicted in FIG. 9A, for example, by reactive ion etching in which $CF_4$ is used as etching gas using the ZEP resist film 41 of the lowest layer having the opening formed in accordance with the gate length as a mask.

Figure 9B:
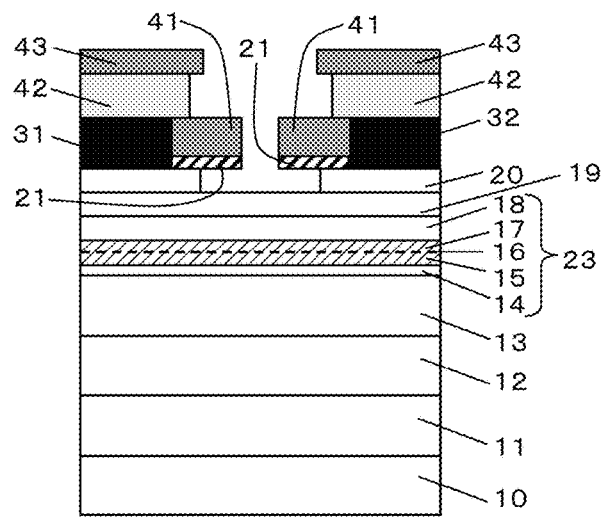

Then, in order to electrically isolate the n-type $In_{0.53}Ga_{0.47}As$ cap layer 20, wet etching is performed, for example, using mixture solution of citric acid ($C_6H_8O_7$) and hydrogen peroxide solution ($H_2O_2$) as etching liquid to form a recess as depicted in FIG. 9B.

Figure 9C:
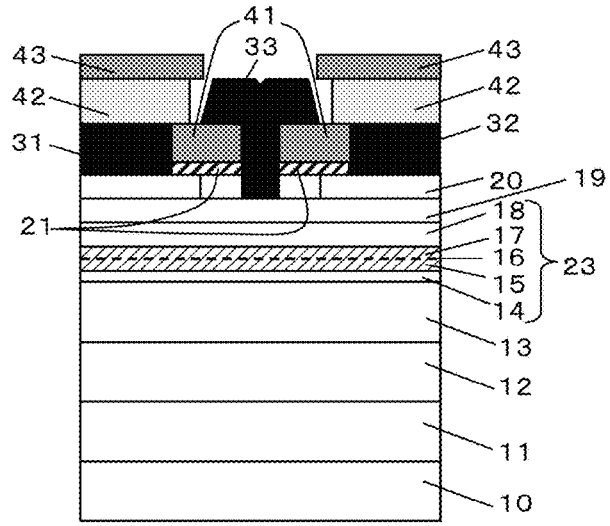

Finally, after, for example, Ti, Pt and Au are vapor-deposited, liftoff is performed to form a T-shaped gate electrode 33 having a three-layer structure of, for example, Ti/Pt/Au as depicted in FIG. 9C. Consequently, the T-shaped gate electrode 33 is formed on the i-InP etching stopping layer 19.

Accordingly, with the semiconductor device according to the present embodiment, there is an advantage that parallel conduction can be suppressed while degradation of a characteristic arising from increase of the delay time period by increase of the ohmic contact resistance is suppressed sufficiently.

Figure 10:
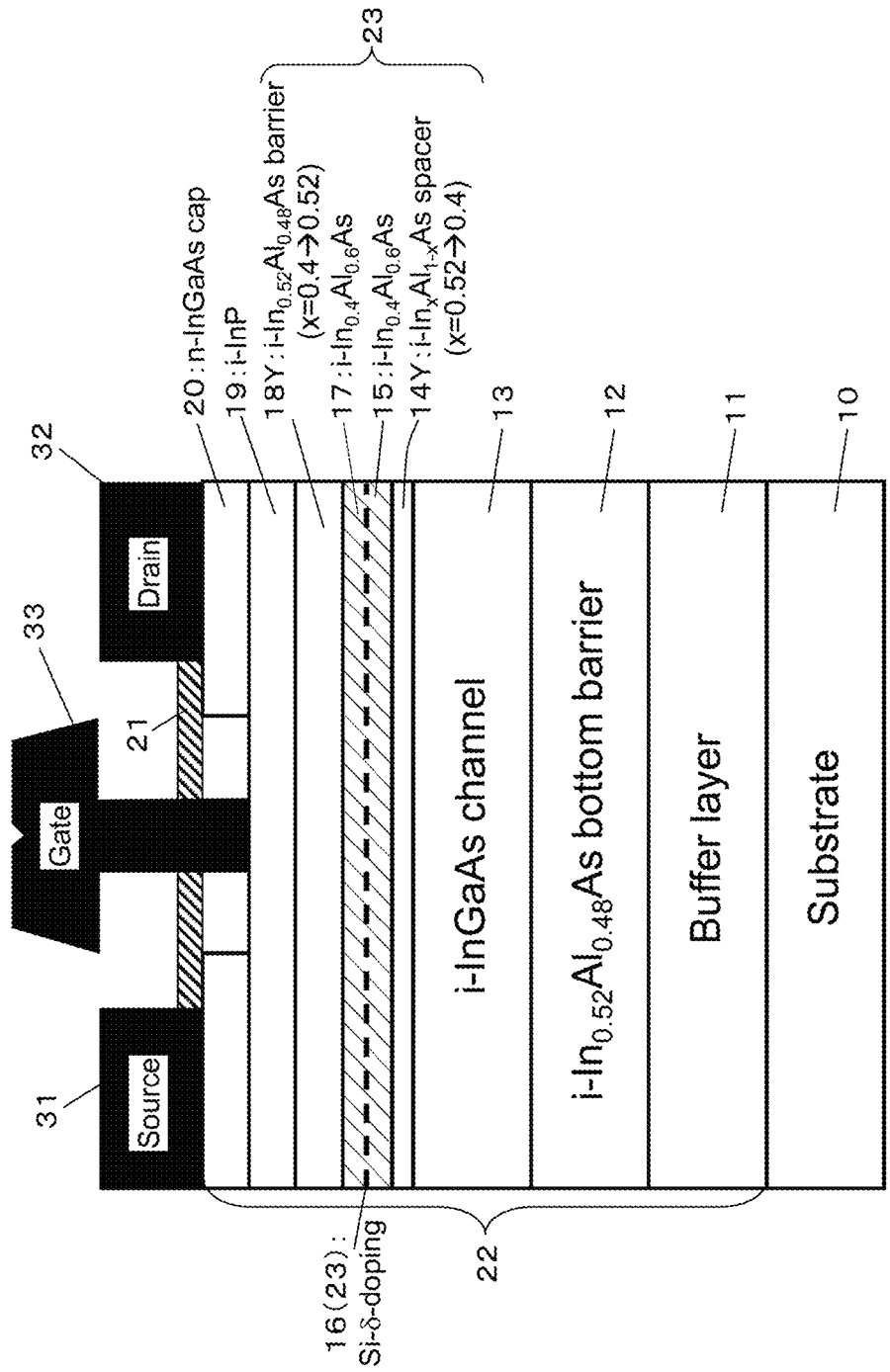
FIG. 10 is a schematic sectional view depicting a configuration of a semiconductor device (InAlAs/InGaAs-based HEMT; InP-based HEMT) of a first modification to the present embodiment.
Figure 11:
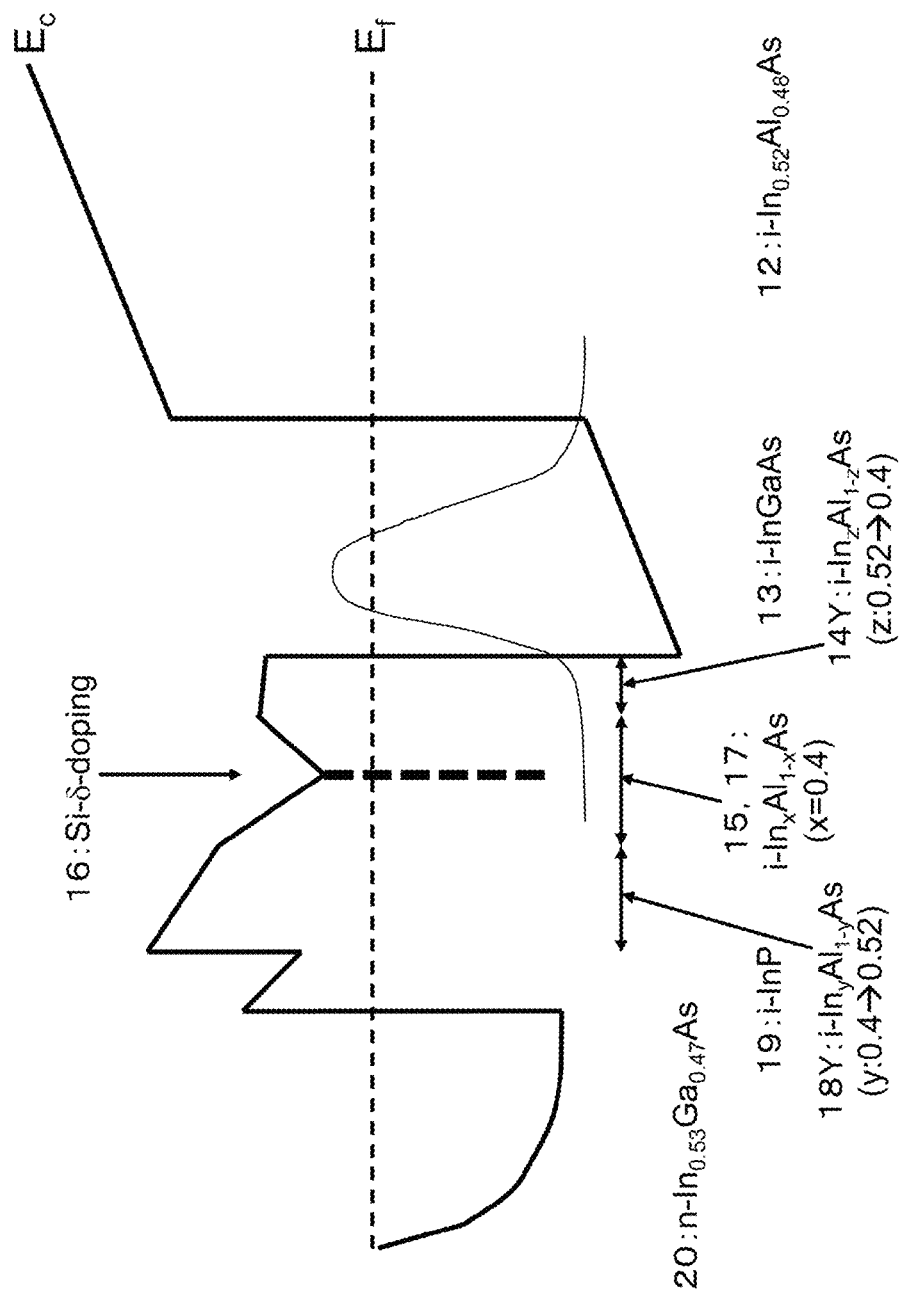
FIG. 11 is a schematic view depicting a conduction band structure of the semiconductor device (InAlAs/InGaAs-based HEMT; InP-based HEMT) of the first modification to the present embodiment.

It is to be noted that, while, in the embodiment described above, the Al composition of the electron supply layer 23 is set to increase stepwise only in the proximity of (around) the δ doped portion, the Al composition is not limited to this. For example, in place of the configuration that an InAlAs layer (here, an $In_{0.52}Al_{0.48}As$ layer) having a fixed composition is provided over and under the portion at which the Al composition in the proximity of the δ doped portion is set high, InAlAs layers having a gradient composition may be provided such that the Al composition gradually increases toward the portion at which the Al composition in the proximity of the δ doped portion is set high. It is to be noted that details of the other part are similar to those of the embodiment described above. This is referred to as first modification. Such a gradient composition InAlAs layer as described above can be formed by gradually increasing the Al composition, for example, from $In_{0.52}Al_{0.48}As$ that lattice-matches with the $In_{0.53}Al_{0.47}As$ electron transit layer 13 to $In_{0.4}Al_{0.6}As$ and performing δ doping while maintaining the composition and then further maintaining the composition, whereafter the Al composition is gradually decreased to $In_{0.52}Al_{0.48}As$. In this case, as depicted in FIG. 10, the electron supply layer 23 has a structure that an i-$In_{0.53}Al_{0.47}As$ (z=0.52 to 0.4; decreases upwardly) spacer layer 14Y, an i-$In_xAl_{1-x}As$ (x<0.52) layer 15 (for example, an i-$In_{0.4}Al_{0.6}As$ layer), an Si-δ doped layer 16, an i-$In_xAl_{1-x}As$ (x<0.52) layer 17 (for example, an i-$In_{0.4}Al_{0.6}As$ layer), and an i-$In_yAl_{1-y}As$ (y=0.4 to 0.52; increases upwardly) barrier layer 18Y are stacked in order. The conduction band structure becomes such as depicted in FIG. 11. It is to be noted that, in FIG. 11, a thin broken line indicates a Fermi level $E_f$ and a thick broken line indicates that the portion is Si-δ-doped, and a waveform in an InGaAs channel layer indicates an electron distribution. In such a structure as just described, similarly as in the embodiment (refer to FIG. 2) described above, the energy of the conduction band $E_c$ does not decrease so much at the δ doped portion and in the proximity of the δ doped portion as that in the first comparative example (refer to FIG. 4) described hereinabove and parallel conduction in which the δ doped portion functions as a channel in which electrons are conducted can be suppressed. Therefore, degradation of a characteristic by parallel conduction can be suppressed. Further, although the ohmic contact resistance increases exceeding that of the embodiment described above, the ohmic contact resistance does not increase so much as that in the second comparative example (refer to FIG. 6) described hereinabove. Therefore, degradation of a characteristic arising from increase of the delay time period by increase of the ohmic contact resistance can be suppressed. Further, similarly as in the embodiment (refer to FIG. 2) described hereinabove, the energy of the conduction band $E_c$ of the electron supply layer 23 is only partially increased. Therefore, degradation of a characteristic arising from increasing of the delay time period by increase of the ohmic contact resistance can be sufficiently suppressed, and it can be suppressed that parallel conduction is caused by dispersion of an n-type impurity in the δ doped portion to degrade a characteristic.

Further, while, in the embodiment described above, the electron supply layer 23 has a structure that the InAlAs spacer layer 14, InAlAs layer 15, Si-δ doped layer 16, InAlAs layer 17 and InAlAs barrier layer 18 are stacked in order, the structure of the electron supply layer 23 is not limited to this.

Figure 12:
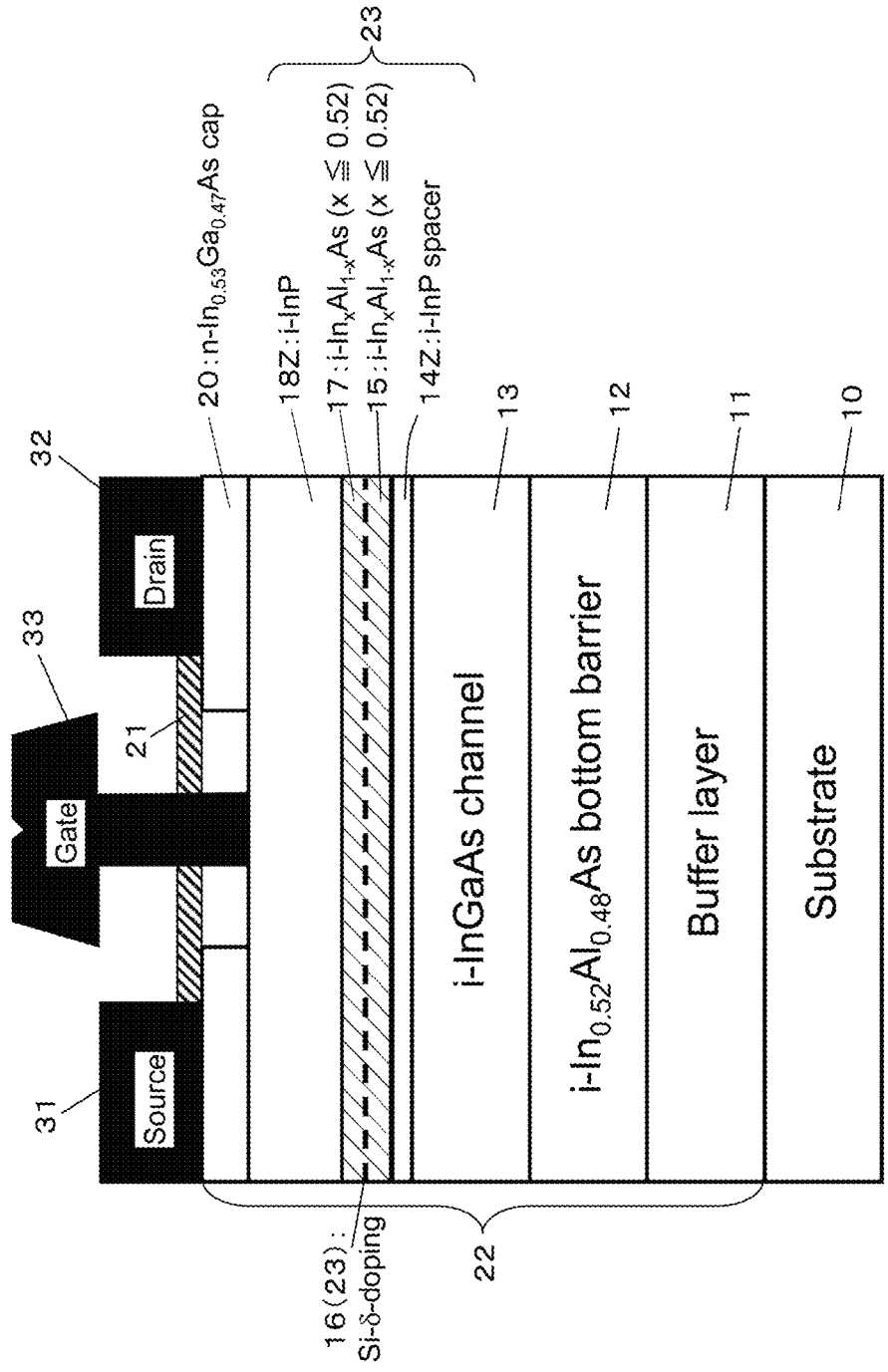
FIG. 12 is a schematic sectional view depicting a configuration of a semiconductor device (InP-based HEMT) of a second modification to the present embodiment.
Figure 13:
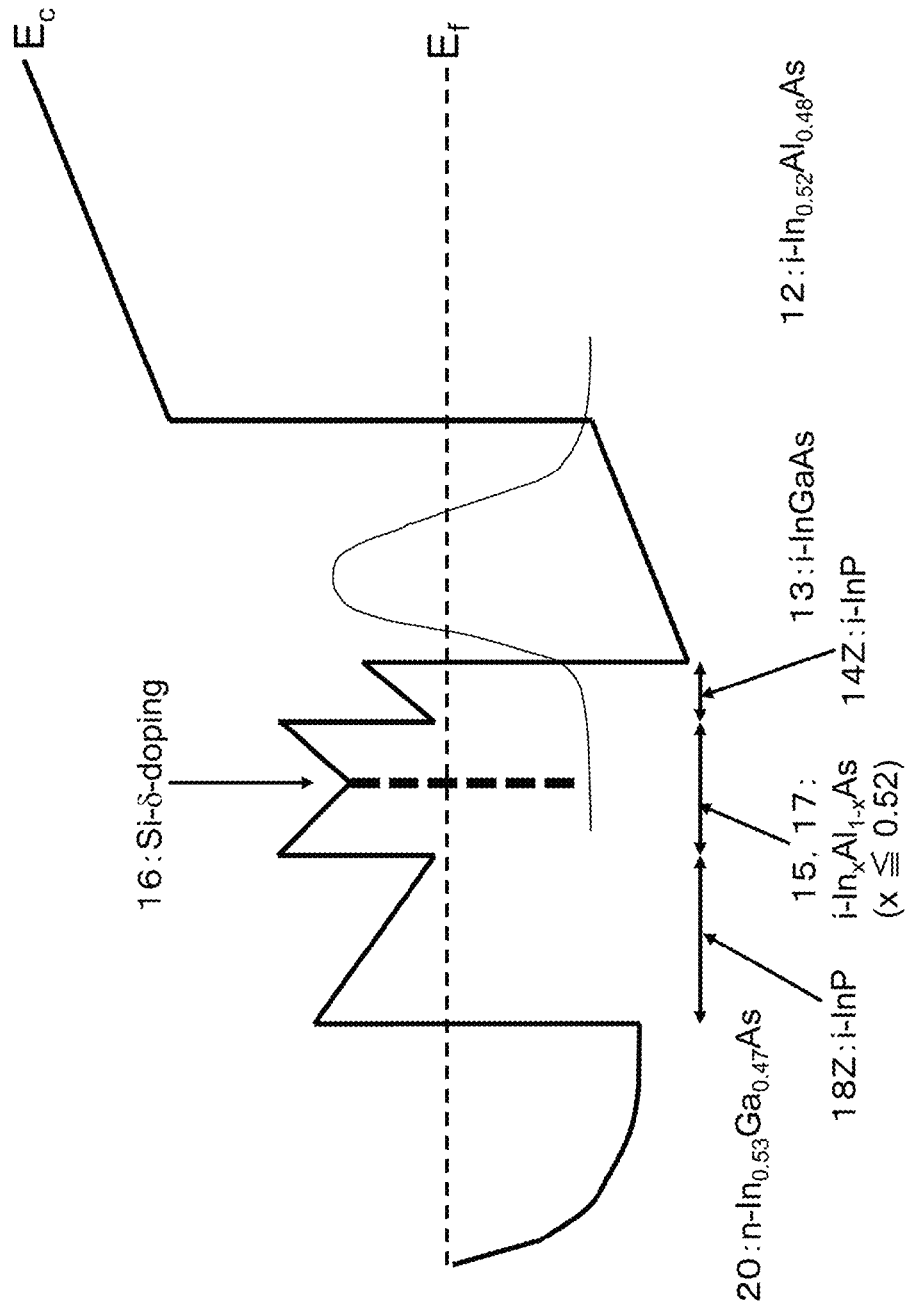
FIG. 13 is a schematic view depicting a conduction band structure of the semiconductor device (InP-based HEMT) of the second modification to the present embodiment.

For example, as depicted in FIG. 12, the electron supply layer 23 may be configured so as to have a structure that an InP spacer layer 14Z (second portion), an InAlAs layer 15 (first portion; undoped portion), an Si-δ doped layer 16 (first portion; doped portion), an InAlAs layer 17 (first portion; undoped portion) and an InP barrier layer 18Z (second portion) are stacked in order. It is to be noted that, in this case, the InP barrier layer 18Z functions also as an etching stopping layer. Further, in this case, the first portion and the second portion include semiconductor materials different from each other. For example, the electron supply layer 23 may be configured so as to have a structure that an i-InP spacer layer 14Z, an i-$In_{0.52}Al_{0.48}As$ layer 15, an Si-δ doped layer 16, an i-$In_{0.52}Al_{0.48}As$ layer 17 and an i-InP barrier layer 18Z are stacked in order. It is to be noted that, while the InAlAs layers 15 and 17 here (namely, InAlAs layers 15 and 17 for which δ doping is to be performed) that sandwich the Si-δ doped layer 16 are i-$In_{0.52}Al_{0.48}As$ layers that lattice-match with InP, the configuration of the InAlAs layers 15 and 17 is not limited to this. For example, the Al composition may be increased (for example, formed as i-$In_{0.4}Al_{0.6}As$ layers) and the energy (potential) of the conduction band of the δ doped portion and in the proximity of the portion may be increased. Therefore, the InAlAs layers 15 and 17 that sandwich the Si-δ doped layer 16 (namely, the InAlAs layers 15 and 17 for which δ doping is to be performed) may be i-$InAl_{1-x}As$ (x≤0.52) layers. Where such a configuration as just described is applied, the conduction band structure becomes such as depicted in FIG. 13. It is to be noted that, in FIG. 13, a thin broken line indicates a Fermi level $E_f$ and a thick broken line indicates that the portion is Si-δ-doped, and a waveform in an InGaAs channel layer indicates an electron distribution. It is to be noted that details of the other part are similar to those of the embodiment described above. This is referred to as second modification. Even if the semiconductor device according to the second modification configured in such a manner as described above is applied, an effect similar to that of the embodiment described above can be obtained.

Further, while the embodiment is described taking an InP-based HEMT (InAlAs/InGaAs-based HEMT) as an example, the material system is not limited to this.

Figure 14:
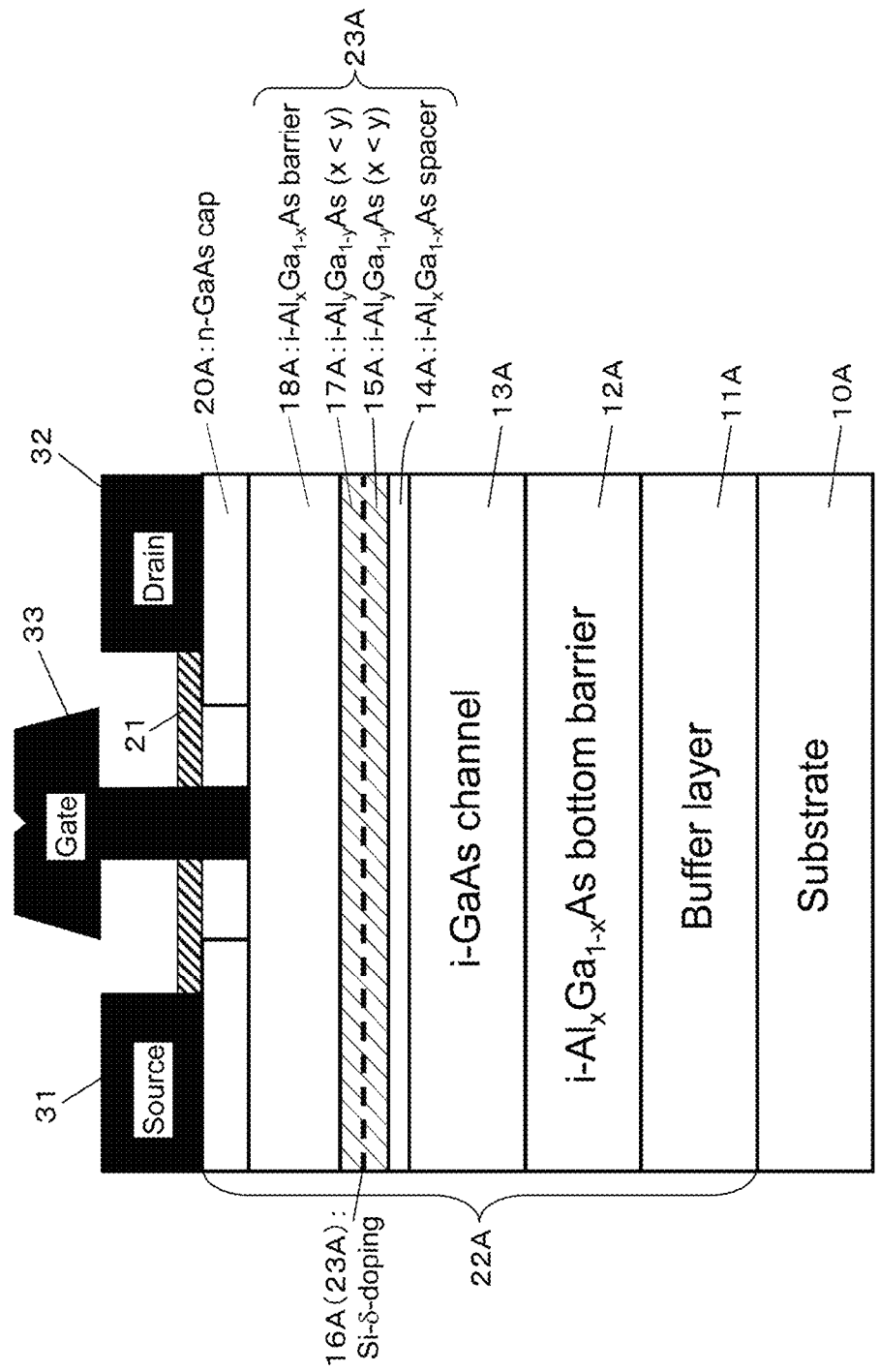
FIG. 14 is a schematic sectional view depicting a configuration of a semiconductor device (AlGaAs/GaAs-based HEMT) of a third modification to the present embodiment.
Figure 15:
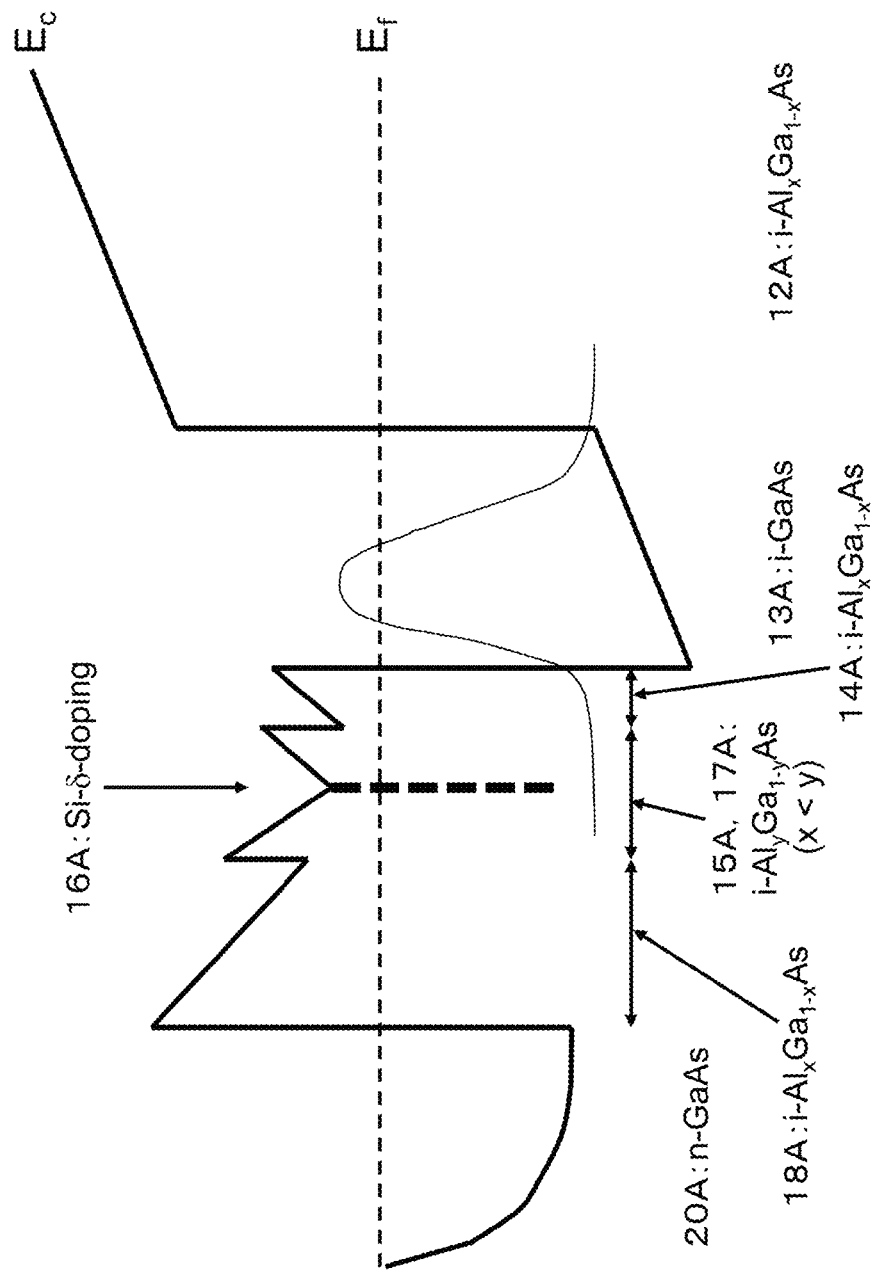
FIG. 15 is a schematic view depicting a conduction band structure of the semiconductor device (AlGaAs/GaAs-based HEMT) of the third modification to the present embodiment.

For example, the present invention can be applied also to an AlGaAs/GaAs-based HEMT. For example, as depicted in FIG. 14, a semiconductor stacked structure 22A may be provided in which a buffer layer 11A, an AlGaAs lower barrier layer 12A, a GaAs electron transit layer 13A, an AlGaAs electron supply layer 23A and a GaAs cap layer 20A are stacked in order on a GaAs substrate 10A. For example, a semiconductor stacked structure 22A may be provided in which a buffer layer 11A, an i-$Al_xGa_{1-x}As$ lower barrier layer 12A, an i-GaAs electron transit layer 13A, an i-AlGaAs electron supply layer 23A and an n-GaAs cap layer 20A are stacked in order on the GaAs substrate 10A. Further, the i-AlGaAs electron supply layer 23A may be configured so as to have a structure that an i-$Al_xGa_{1-x}As$ spacer layer 14A (second portion), an i-Al$_y$Ga$_{1-y}$As layer 15A (first portion; undoped portion), an Si-δ doped layer 16A (first portion; doped portion), an i-Al$_y$Ga$_{1-y}$As (x<y) layer 17A (first portion; undoped portion) and an i-Al$_x$Ga$_{1-x}$As barrier layer 18A (second portion) are stacked in order. Here, the difference between x and y is required to be approximately 0.1 and, for example, x and y may be set to x=0.3 and y=0.4, respectively. In this manner, similarly as in the embodiment described above, the Al composition of AlGaAs configuring the electron supply layer 23A may be partially increased only in the proximity of the δ doped portion such that the energy of the conduction band E$_c$ of the electron supply layer 23A is partially increased only in the proximity of the δ doped portion. Where such a configuration as just described is applied, the conduction band structure becomes such as depicted in FIG. 15. It is to be noted that, in FIG. 15, a thin broken line indicates a Fermi level E$_f$ and a thick broken line indicates that the portion is Si-δ-doped, and a waveform in an InGaAs channel layer indicates an electron distribution. It is to be noted that the electron transit layer 13 may be configured as an InGaAs layer such as, for example, an In$_{0.15}$Ga$_{0.85}$As layer by adding some InAs thereto. In this case, the cap layer 20A may be configured as a GaAs layer (n-type GaAs layer), an InGaAs layer (n-type InGaAs layer) or a layer in which an InGaAs layer and a GaAs layer are stacked (layer in which an n-type InGaAs layer and an n-type GaAs layer are stacked). This is referred to as AlGaAs/InGaAs-based HEMT. This is referred to as third modification. Also with the third modification configured in such a manner as just described, an effect similar to that achieved by the embodiment described above can be achieved. It is to be noted that a gradient composition AlGaAs layer may be used for the barrier layer 18A and the spacer layer 14A configuring the electron supply layer 23A of the third modification as in the first modification described above. Also where such a configuration as just described is applied, similarly as in the embodiment described above, the first and second portions contain Al. Further, the first portion has an Al composition higher than that of the second portion and has energy of the conduction band E$_c$ higher than that of the second portion. In particular, the first portion and the second portion include semiconductor materials same as each other but include compositions different from each other. Further, the first portion has a doped portion doped with an n-type impurity and undoped portions that sandwich the doped portion and are not doped with an impurity. Further, the doped portion is a portion at which an n-type impurity is planar-doped, and the n-type impurity is Si. Further, the second portion is not doped with an impurity. It is to be noted that an AlGaAs/GaAs-based chemical semiconductor or an AlGaAs/InGaAs-based chemical compound is referred to as III-V group chemical compound.

Figure 16:
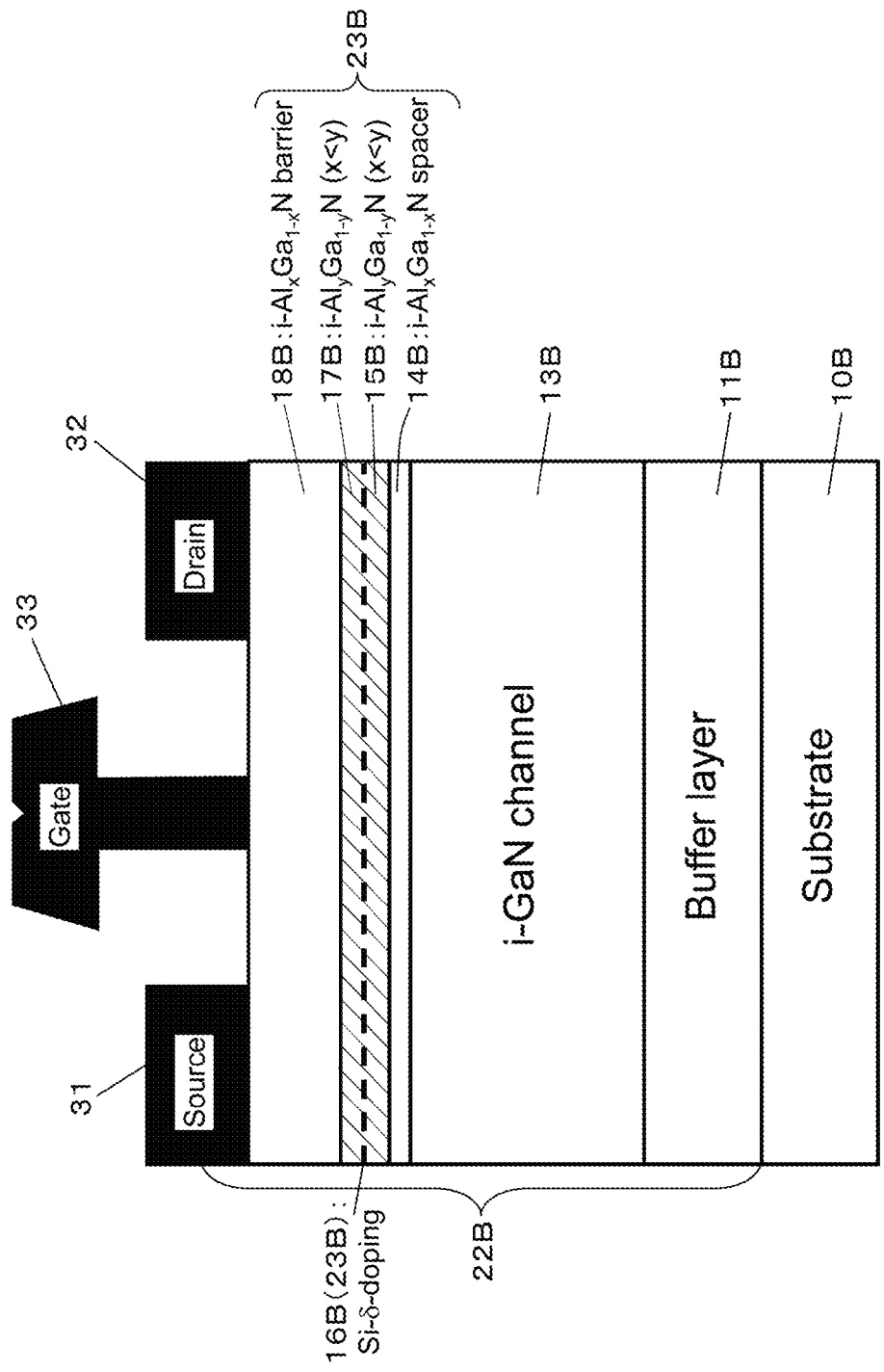
FIG. 16 is a schematic sectional view depicting a configuration of a semiconductor device (AlGaN/GaN-based HEMT) of a fourth modification to the present embodiment.
Figure 17:
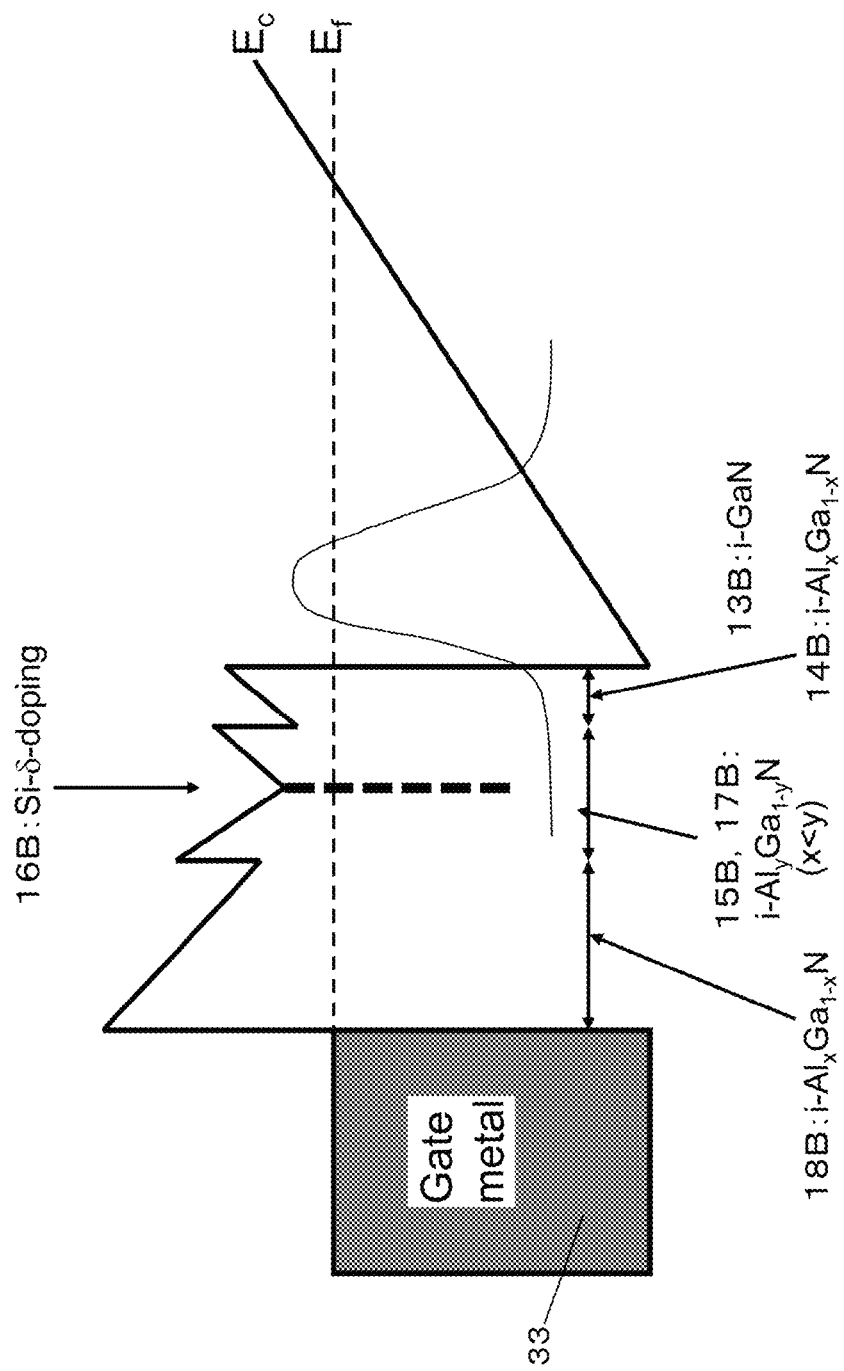
FIG. 17 is a schematic view depicting a conduction band structure of the semiconductor device (AlGaN/GaN-based HEMT) of the fourth modification to the present embodiment.

Further, the present invention can be applied, for example, also to an AlGaN/GaN-based HEMT. For example, as depicted in FIG. 16, a semiconductor stacked structure 22B may be provided in which a buffer layer 11B, a GaN electron transit layer 13B and an AlGaN electron supply layer 23B are stacked in order on an SiC substrate 10B. For example, a semiconductor stacked structure 22B may be provided in which a buffer layer 11B, an i-GaN electron transit layer 13B and an i-AlGaN electron supply layer 23B are stacked in order on an SiC substrate 10B. Further, the i-AlGaN electron supply layer 23B may be configured so as to have a structure that an i-Al$_x$Ga$_{1-x}$N spacer layer 14B (second portion), an i-Al$_y$Ga$_{1-y}$N (x<y) layer 15B (first portion; undoped portion), an Si-δ doped layer 16B (first portion; doped portion), an i-Al$_y$Ga$_{1-y}$N (x<y) layer 17B (first portion; undoped portion) and an i-Al$_x$Ga$_{1-x}$N barrier layer 18B (second portion) are stacked in order. Here, the difference between x and y may be approximately 0.05 and, for example, x and y may be set to x=0.25 and y=0.30, respectively. In this manner, similarly as in the embodiment described above, the Al composition (AlN composition) of AlGaN configuring the electron supply layer 23B is partially increased only in the proximity of the δ doped portion such that the energy of the conduction band E$_c$ of the electron supply layer 23B is partially increased only in the proximity of the δ doped portion. Where such a configuration as just described is applied, the conduction band structure becomes such as depicted in FIG. 17. It is to be noted that, in FIG. 17, a thin broken line indicates a Fermi level E$_f$ and a thick broken line indicates that the portion is Si-δ-doped, and a waveform in a GaN channel layer indicates an electron distribution. It is to be noted that, while AlGaN is used as a semiconductor material configuring the layers of the electron supply layer 23B, the semiconductor material is not limited to this and, for example, an InAlN layer may be used. This is referred to as InAlN/GaN-based HEMT. Further, also confining of electrons can be improved by providing, for example, an i-Al$_z$Ga$_{1-z}$N lower barrier layer at the lower side of the electron transit layer 13B. In this case, z may be approximately 0.05 to approximately 0.10. Further, an n-type GaN cap layer may be provided on the electron supply layer 23B. It is to be noted that the ohmic resistance can be decreased by providing the Si-δ doped layer 16B in the AlGaN/GaN-based HEMT or an InAlN/GaN-based HEMT. This is referred to as fourth modification. Also with the fourth modification configured in such a manner as just described, an effect similar to that achieved by the embodiment described above can be achieved. It is to be noted that a gradient composition AlGaN layer may be used for the barrier layer 18B and the spacer layer 14B configuring the electron supply layer 23B of the fourth modification as in the first modification described above. Also where such a configuration as just described is applied, similarly as in the embodiment described above, the first and second portions contain Al. Further, the first portion has an Al composition higher than that of the second portion and has energy of the conduction band higher than that of the second portion. In particular, the first portion and the second portion include semiconductor materials same as each other but include compositions different from each other. Further, the first portion has a doped portion doped with an n-type impurity and undoped portions that sandwich the doped portion and are not doped with an impurity. Further, the doped portion is a portion at which an n-type impurity is planar-doped, and the n-type impurity is Si. Further, the second portion is not doped with an impurity. It is to be noted that an AlGaN/GaN-based chemical semiconductor or an InAlN/GaN-based chemical compound is referred to as III-V group chemical compound. It is to be noted that also a sapphire substrate or an Si (111) substrate can be used as the substrate 10B for use for a nitride semiconductor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
a semiconductor stacked structure including at least an electron transit layer and an electron supply layer over a substrate; wherein
the electron supply layer includes a first portion and second portions sandwiching the first portion; and
the first portion has a higher energy of a conduction band than that of the second portions, and the first portion having the higher energy of the conduction band than that of the second portions includes a doped portion doped with an n-type impurity and undoped portions that sandwich the doped portion and are not doped with an impurity.

2. The semiconductor device according to claim 1, wherein the first portion and the second portions include the same semiconductor material but include compositions different from each other.

3. The semiconductor device according to claim 2, wherein the first portion and the second portions contain Al; and
the first portion has a higher composition of Al than that of the second portions.

4. The semiconductor device according to claim 1, wherein the first portion and the second portions include semiconductor materials different from each other.

5. The semiconductor device according to claim 1, wherein the second portions are not doped with an impurity.

6. The semiconductor device according to claim 1, wherein the doped portion is a planar-doped portion with an n-type impurity.

7. The semiconductor device according to claim 1, wherein the n-type impurity is Si.

8. The semiconductor device according to claim 1, wherein the electron transit layer contains InGaAs;
the first portion and the second portions contain InAlAs; and
the first portion has a higher composition of Al than that of the second portion.

9. The semiconductor device according to claim 1, wherein the electron transit layer contains InGaAs;
the first portion contains InAlAs; and
the second portions contain InP.

10. The semiconductor device according to claim 1, wherein the electron transit layer contains GaAs or InGaAs;
the first portion and the second portions contain AlGaAs; and
the first portion has a higher composition of Al than that of the second portion.

11. The semiconductor device according to claim 1, wherein the electron transit layer contains GaN;
the first portion and the second portions contain AlGaN or InAlN; and
the first portion has a higher composition of Al than that of the second portion.

12. The semiconductor device according to claim 1, wherein the first portion and the second portions contain Al;
the first portion has a higher composition of Al than that of the second portions; and
the Al composition of the second portions increases toward the first portion.

13. The semiconductor device according to claim 1, wherein the first portion has the higher energy of the conduction band than that of the second portions such that an energy of a conduction band of the doped portion does not drop to a level equal to or lower than the Fermi energy.

* * * * *